(12) United States Patent
Chen et al.

(10) Patent No.: US 12,336,249 B2
(45) Date of Patent: Jun. 17, 2025

(54) GATE SPACER AND FORMATION METHOD THEREOF

(71) Applicant: TAIWAN SEMICONDUCTOR MANUFACTURING COMPANY, LTD., Hsinchu (TW)

(72) Inventors: Yi-Rui Chen, Yilan County (TW); Yi-Fan Chen, New Taipei (TW); Szu-Ying Chen, Hsinchu (TW); Sen-Hong Syue, Hsinchu County (TW); Huicheng Chang, Tainan (TW); Yee-Chia Yeo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 485 days.

(21) Appl. No.: 17/696,257

(22) Filed: Mar. 16, 2022

(65) Prior Publication Data
US 2023/0299175 A1    Sep. 21, 2023

(51) Int. Cl.
*H10D 64/01* (2025.01)
*H01L 21/02* (2006.01)
*H10D 64/66* (2025.01)
*H10D 30/01* (2025.01)

(52) U.S. Cl.
CPC ....... *H10D 64/017* (2025.01); *H01L 21/0214* (2013.01); *H01L 21/02211* (2013.01); *H01L 21/0228* (2013.01); *H01L 21/02323* (2013.01); *H01L 21/02337* (2013.01); *H01L 21/02343* (2013.01); *H10D 64/01* (2025.01); *H10D 64/671* (2025.01); *H10D 30/024* (2025.01)

(58) Field of Classification Search
CPC .......... H01L 29/66545; H01L 21/0214; H01L 21/02211
See application file for complete search history.

(56) References Cited

U.S. PATENT DOCUMENTS

| | | | |
|---|---|---|---|
| 7,157,359 B2 * | 1/2007 | Park ................. | H01L 21/28088 438/653 |
| 8,815,679 B1 * | 8/2014 | Yen ......................... | H10D 1/47 438/396 |
| 8,962,400 B2 | 2/2015 | Tsai et al. | |
| 9,093,514 B2 | 7/2015 | Tsai et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |

(Continued)

FOREIGN PATENT DOCUMENTS

| | | | | |
|---|---|---|---|---|
| CN | 117954447 A | * | 4/2024 | ..... H01L 21/823412 |
| DE | 102023107765 A1 | * | 5/2024 | ..... H01L 21/823412 |

(Continued)

*Primary Examiner* — Laura M Menz
(74) *Attorney, Agent, or Firm* — Birch, Stewart, Kolasch & Birch, LLP

(57) ABSTRACT

A method of forming a semiconductor device includes forming a sacrificial gate structure over a substrate, depositing a spacer layer on the sacrificial gate structure in a conformal manner, performing a multi-step oxidation process to the spacer layer, etching the spacer layer to form gate sidewall spacers on opposite sidewalls of the sacrificial gate structure, removing the sacrificial gate structure to form a trench between the gate sidewalls spacers, and forming a metal gate structure in the trench.

20 Claims, 22 Drawing Sheets

(56) References Cited

U.S. PATENT DOCUMENTS

| | | | |
|---|---|---|---|
| 9,236,267 B2 | 1/2016 | De et al. | |
| 9,245,805 B2 | 1/2016 | Yeh et al. | |
| 9,418,897 B1 | 8/2016 | Ching et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 9,812,363 B1 | 11/2017 | Liao et al. | |
| 9,818,872 B2 * | 11/2017 | Ching | H10D 30/43 |
| 9,859,380 B2 | 1/2018 | Lee et al. | |
| 9,887,269 B2 * | 2/2018 | Ching | H10D 30/6735 |
| 9,899,269 B2 * | 2/2018 | Ching | H10D 84/0128 |
| 10,170,608 B2 * | 1/2019 | Cheng | H10D 30/014 |
| 10,170,609 B2 * | 1/2019 | Cheng | H10D 30/014 |
| 10,361,289 B1 * | 7/2019 | Zhao | H01L 21/0214 |
| 10,516,049 B2 * | 12/2019 | Ching | H10D 30/797 |
| 10,811,509 B2 * | 10/2020 | Ching | H10D 86/011 |
| 10,811,515 B2 * | 10/2020 | Lin | H10D 64/015 |
| 10,868,143 B2 * | 12/2020 | Chang | H10D 84/0133 |
| 11,355,611 B2 * | 6/2022 | Ching | H10D 30/6735 |
| 11,437,491 B2 * | 9/2022 | Lin | H01L 21/0234 |
| 11,437,513 B2 * | 9/2022 | Ching | H10D 62/822 |
| 11,791,401 B2 * | 10/2023 | Chen | H10D 62/116 257/288 |
| 11,923,432 B2 * | 3/2024 | Liu | H10D 84/0158 |
| 11,942,548 B2 * | 3/2024 | Ching | H10D 64/017 |
| 11,978,674 B2 * | 5/2024 | Chang | H10D 62/364 |
| 12,046,660 B2 * | 7/2024 | Lin | H01L 21/02274 |
| 2003/0042557 A1 * | 3/2003 | Shimamoto | H10D 64/693 257/E21.01 |
| 2013/0244416 A1 * | 9/2013 | Ng | H10D 84/038 438/595 |
| 2014/0264753 A1 * | 9/2014 | Yen | H10D 1/47 257/536 |
| 2015/0069328 A1 * | 3/2015 | Leobandung | H10D 30/014 438/151 |
| 2017/0005180 A1 * | 1/2017 | Cheng | H10D 30/6728 |
| 2017/0005188 A1 * | 1/2017 | Cheng | H10D 30/6744 |
| 2017/0005195 A1 * | 1/2017 | Ching | H10D 62/115 |
| 2017/0053912 A1 * | 2/2017 | Ching | H01L 21/764 |
| 2017/0154973 A1 * | 6/2017 | Ching | H10D 30/6757 |
| 2017/0194213 A1 * | 7/2017 | Ching | H10D 84/013 |
| 2018/0047726 A1 * | 2/2018 | Cheng | H10D 84/0135 |
| 2018/0090615 A1 * | 3/2018 | Ching | H10D 62/822 |
| 2018/0151450 A1 * | 5/2018 | Ching | H10D 84/0193 |
| 2018/0166551 A1 * | 6/2018 | Ching | H10D 30/6757 |
| 2020/0152794 A1 * | 5/2020 | Ching | H10D 30/6211 |
| 2020/0168722 A1 * | 5/2020 | Hung | H10D 30/6757 |
| 2021/0050427 A1 * | 2/2021 | Ching | H10D 86/011 |
| 2021/0098586 A1 * | 4/2021 | Lin | H10B 41/30 |
| 2021/0134983 A1 * | 5/2021 | Lin | H01L 21/02326 |
| 2021/0273100 A1 * | 9/2021 | Ching | H10D 30/014 |
| 2022/0037506 A1 * | 2/2022 | Chen | H10D 30/62 |
| 2022/0157664 A1 * | 5/2022 | Chang | H10D 84/0193 |
| 2022/0359696 A1 * | 11/2022 | Chang | H10D 84/83 |
| 2022/0359720 A1 * | 11/2022 | Lin | H01L 21/0234 |
| 2023/0144899 A1 * | 5/2023 | Liu | H10D 30/43 257/401 |
| 2023/0163198 A1 * | 5/2023 | Yu | H10D 84/0128 257/288 |
| 2023/0268422 A1 * | 8/2023 | Wang | H10D 30/62 257/288 |
| 2023/0299175 A1 * | 9/2023 | Chen | H01L 21/02326 257/213 |
| 2023/0299179 A1 * | 9/2023 | Lu | H10D 84/834 257/288 |
| 2024/0274473 A1 * | 8/2024 | Chang | H10D 62/118 |
| 2024/0290850 A1 * | 8/2024 | Fan | H10D 30/014 |
| 2024/0312788 A1 * | 9/2024 | Wang | H10D 30/014 |
| 2024/0347622 A1 * | 10/2024 | Lin | H01L 21/02326 |
| 2024/0363736 A1 * | 10/2024 | Liu | H10D 30/0245 |

FOREIGN PATENT DOCUMENTS

| | | | | |
|---|---|---|---|---|
| DE | 102023129491 A1 * | 9/2024 | | B82Y 40/00 |
| TW | 202418596 A * | 5/2024 | | H01L 21/823412 |

* cited by examiner

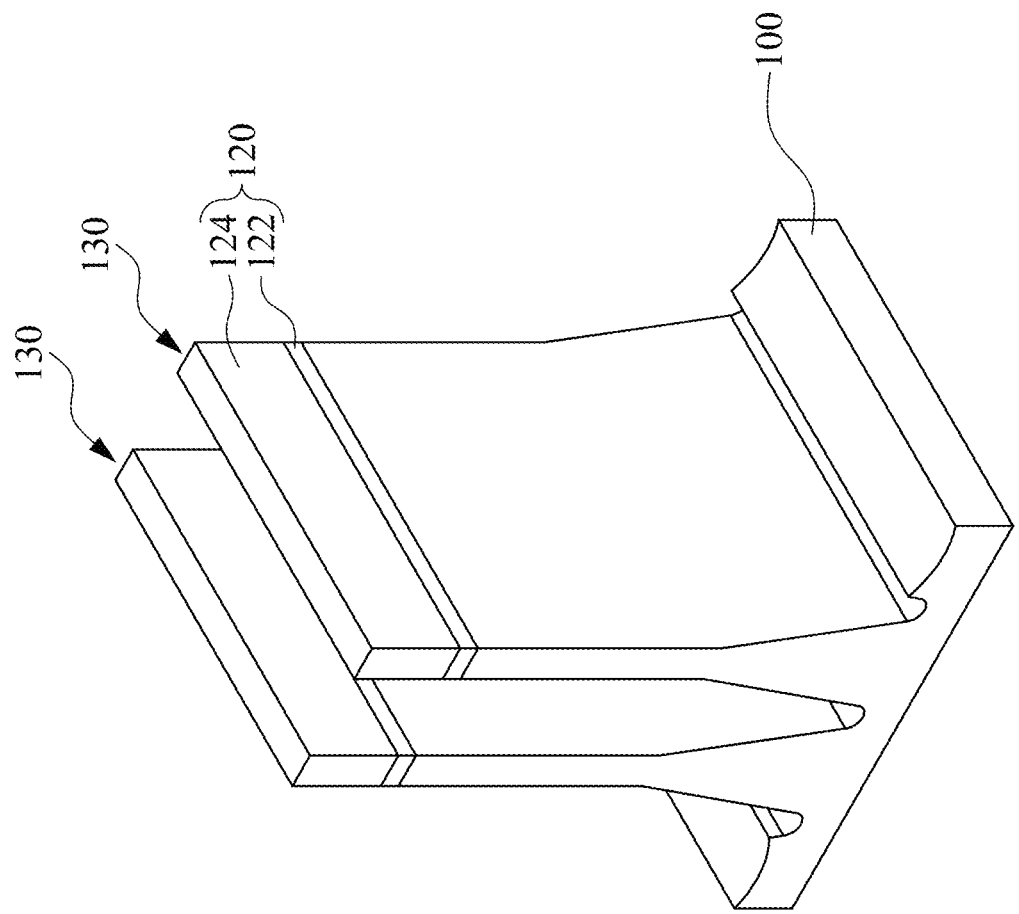
Fig. 3
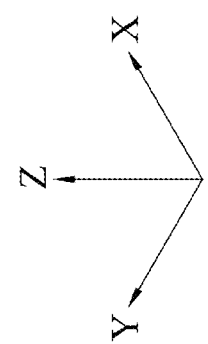

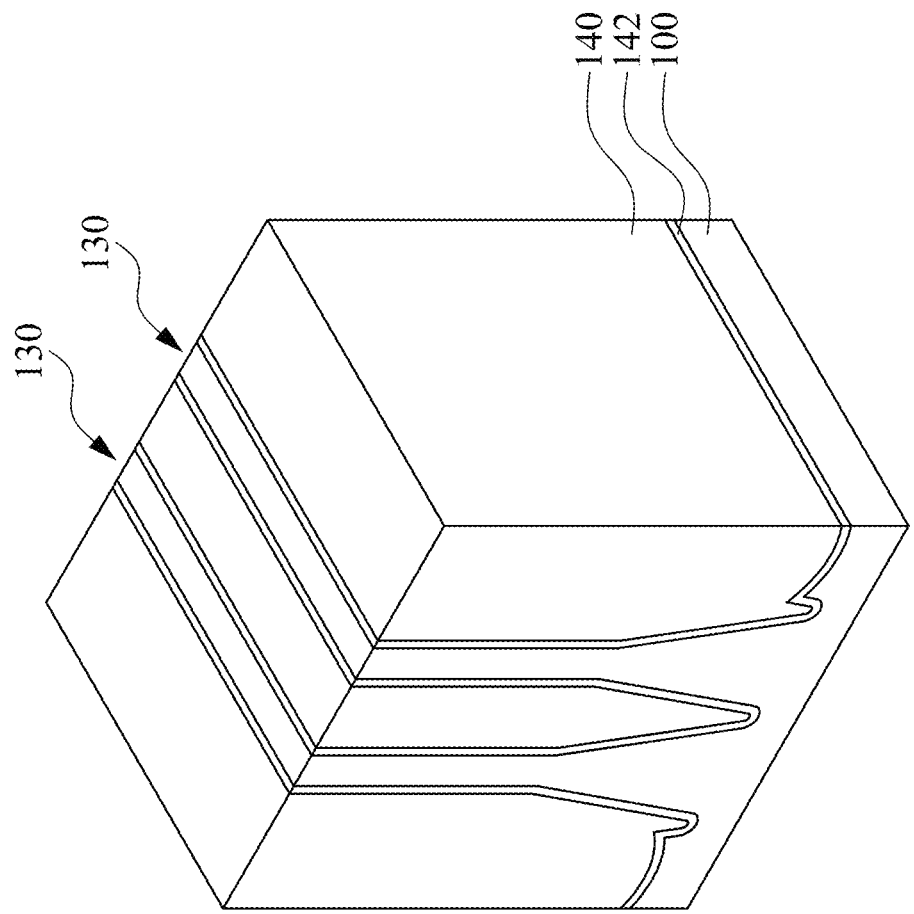
Fig. 4
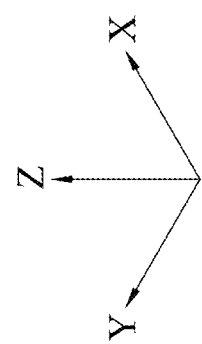

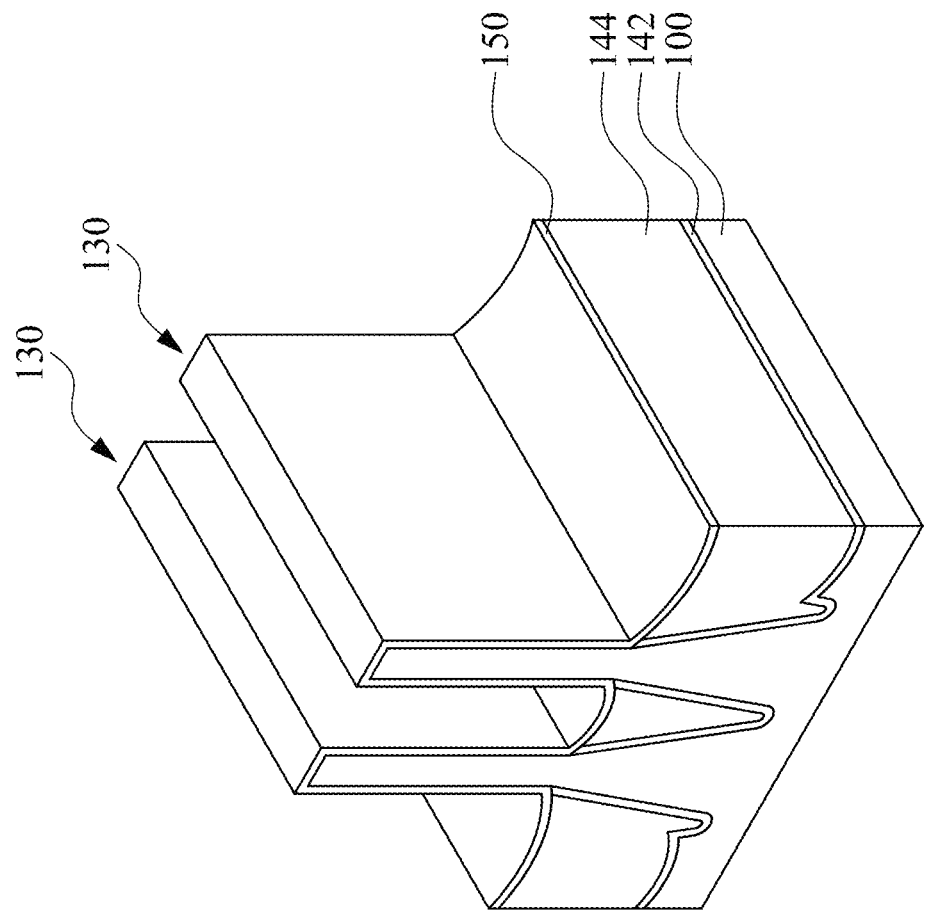
Fig. 6
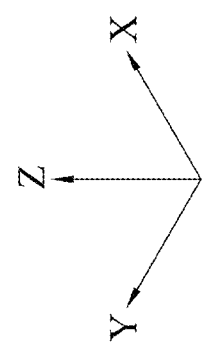

GATE SPACER AND FORMATION METHOD THEREOF

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-8 are perspective views of intermediate stages in the manufacturing of an example of a fin field-effect transistor (FinFET) in accordance with some embodiments.

DETAILED DESCRIPTION

Figure 1:
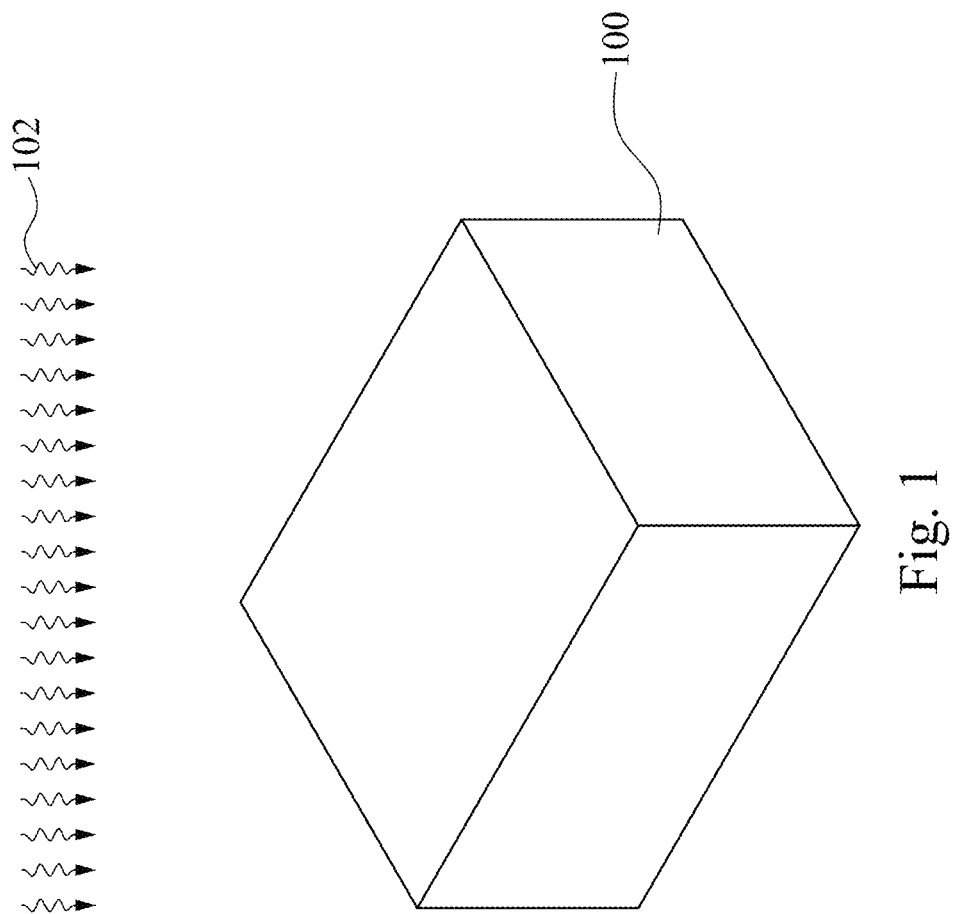

The following disclosure provides many different embodiments, or examples, for implementing different features of the mention Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose s f simplicity and clarity and does not iii itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range, Numerical quantities given herein are approximate, meaning that the term "around," "about," "approximately," or "substantially" can be inferred if not expressly stated.

Embodiments are described below in a particular context, a die comprising fin field effect transistors (FinFETs). Various embodiments may be applied, however, to dies comprising other types of transistors (e.g., planar transistors or the like) in lieu of or in combination with the FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed and the remaining spacers may then be used to pattern the fins.

Embodiments of the present disclosure advantageously perform a process to a gate spacer of a FinFET to tune a carbon (C) concentration and a nitrogen (N) concentration of the gate spacer to improve the trade-off between a dielectric constant and an etch resistance of the gate spacer. In the formation of FinFETs, the gate spacers may be used between the source/drain epitaxial regions and the gate structures.

Reference is now made to FIGS. 1-8 and FIGS. 18-22, which are exemplary sequential processes for manufacturing the fin field effect transistor (FinFET) device according to some embodiments of the present disclosure. It is understood that additional operations can be provided before, during, and after processes shown by FIGS. 1-8 and FIGS. 18-22, and some of the operations described below can be replaced or eliminated, for additional embodiments of the method. The order of the operations/processes may be interchangeable.

Referring to FIG. 1, impurity ions (dopants) 102 are optional implanted into a substrate 100 to form a well region. The ion implantation is performed to prevent a punch-through effect. In some embodiments, the substrate 100 may include in its surface region, one or more buffer layers (not shown). The buffer layers can serve to gradually change the lattice constant from that of the substrate to that of the source/drain regions. The substrate 100 may include various regions that have been suitably doped with impurities (e.g., p-type or n-type conductivity). In some embodiments, the substrate 100 may be a semiconductor substrate such as a silicon substrate. In some embodiments, the substrate 100 may include various layers, including conductive or insulating layers, formed on a semiconductor substrate. In some embodiments, the substrate 100 is a contiguous silicon substrate. The substrate 100 may include various doping configurations depending on design requirements as is known in the art. The substrate 100 may also include other semiconductors such as germanium, silicon carbide (SiC), silicon germanium (SiGe), or diamond. Alternatively, the substrate 100 may include a compound semiconductor and/or an alloy semiconductor. Further, the substrate 100 may optionally include an epitaxial layer (epi-layer), may be strained for performance enhancement, may include a silicon-on-insulator (SOI) structure, and/or have other suitable enhancement features.

Figure 2:
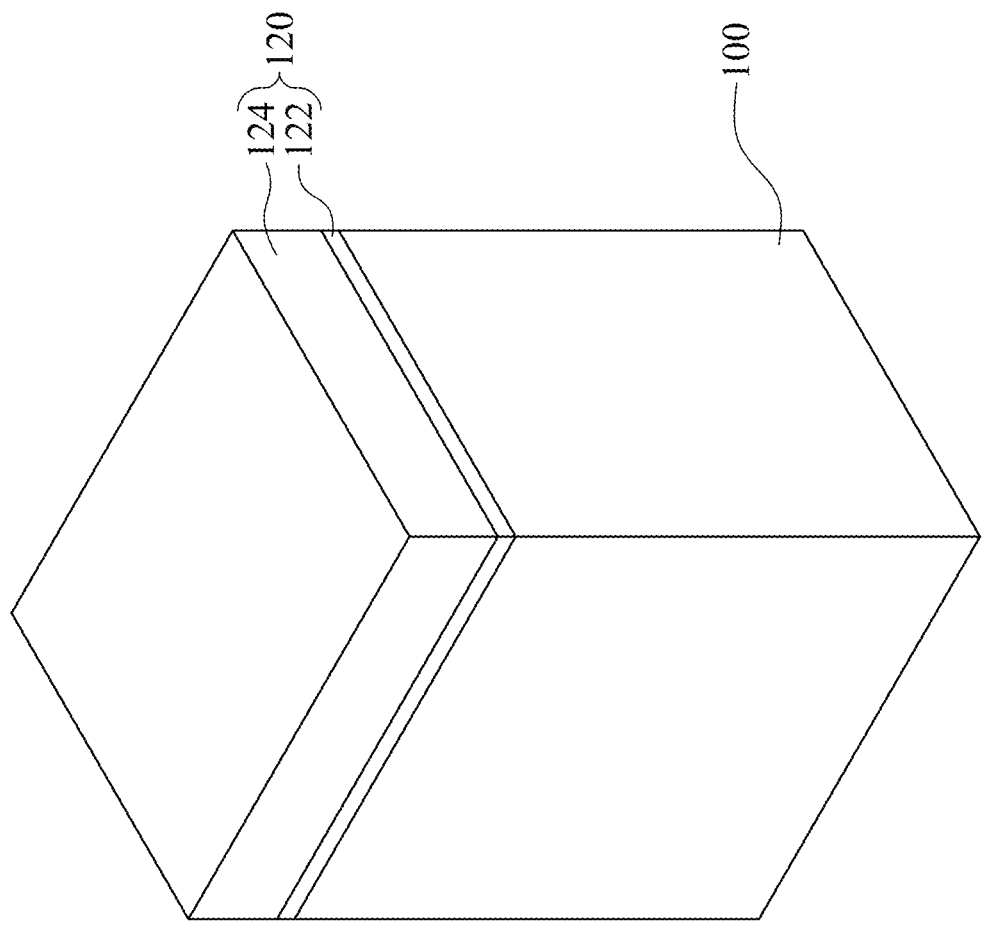

Referring to FIG. 2, a mask layer 120 is formed over the substrate 100. In some embodiments, the mask layer 120 includes a first mask layer 122 and a second mask layer 124. The first mask layer 122 is a pad oxide layer made of a silicon oxide, which can be formed by a thermal oxidation. The second mask layer 124 is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 120 is then patterned into a mask pattern by using patterning operations including photo-lithography and etching, Next, as shown in FIG. 3, the substrate 100 is patterned by using the patterned mask layer, thereby the substrate 100 is formed into fin structures 130 extending in the X direction. In FIG. 3, two fin structures 130 are arranged in the Y direction. But the number of the fin structures is not limited to, and may be as small as one and three or more. In some embodiments, one or more dummy fin structures are formed on both sides of the fin structures 130 to improve pattern fidelity in the patterning operations.

Referring to FIG. 4, after the fin structures 130 are formed, an insulating material layer 140 including one or more layers of insulating material is formed over the substrate 100 so that the fin structures 130 are fully embedded in the insulating material layer 140. The insulating material for the insulating material layer 140 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating material layer 140. Then, a planarization operation, such as a chemical mechanical polishing (CMP) method and/or an etch-back method, is performed such that the upper surface of the fin structures 130 is exposed from the insulating material layer 140. In some embodiments, a first liner layer 142 is formed over the structure of FIG. 3 before forming the insulating material layer 140. The first liner layer 142 is made of SiN or a silicon nitride-based material (e.g., SiON, SiCN or SiOCN).

Figure 5:
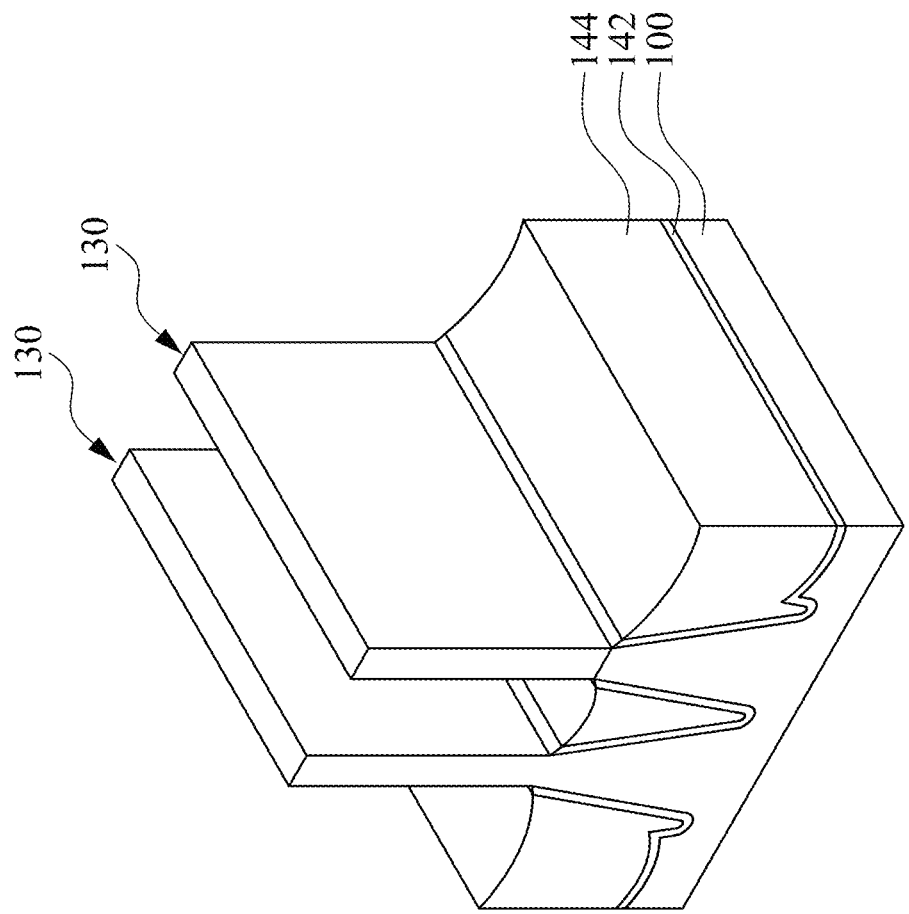

Then, as shown in FIG. 5, the insulating material layer 140 (as shown in FIG. 4) is recessed to form a shallow trench isolation (STI) region 144 so that the upper portions of the fin structures 130 are exposed. With this operation, the fin structures 130 are electrically insulated from each other by the STI region 144.

After the STI region 144 is formed, a sacrificial gate dielectric layer 150 is formed, as shown in FIG. 6. The sacrificial gate dielectric layer 150 includes one or more layers of insulating material, such as a silicon oxide-based material. In one embodiment, silicon oxide formed by CVD is used.

Figure 7:
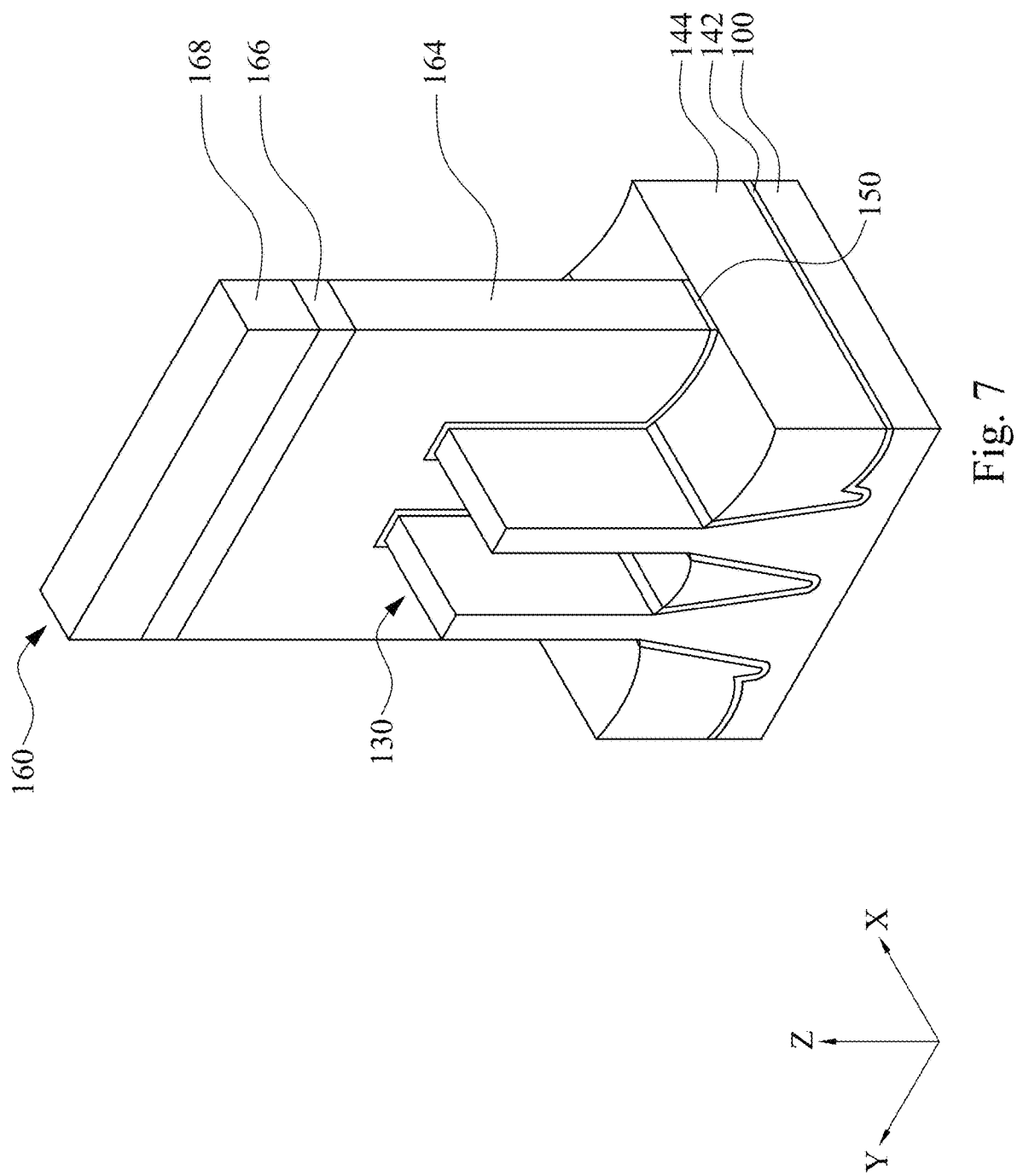

Afterwards, a sacrificial gate layer and a mask layer (e.g., having a pad SiN layer and a silicon oxide mask layer) are formed over the sacrificial gate dielectric layer 150, followed by patterning the mask layer, the sacrificial gate electrode layer and the sacrificial gate dielectric layer 150 into the sacrificial gate structure 160, as shown in FIG. 7. The sacrificial gate structure 160 includes the sacrificial gate dielectric layer 150, the sacrificial gate electrode layer 164 (e.g., poly silicon), the pad SiN layer 166 and the silicon oxide mask layer 168. The fin structures 130 are partially exposed on opposite sides of the sacrificial gate structure 160, thereby defining source/drain (S/D) regions. In this disclosure, a source and a drain are interchangeably used and the structures thereof are substantially the same.

Figure 8:
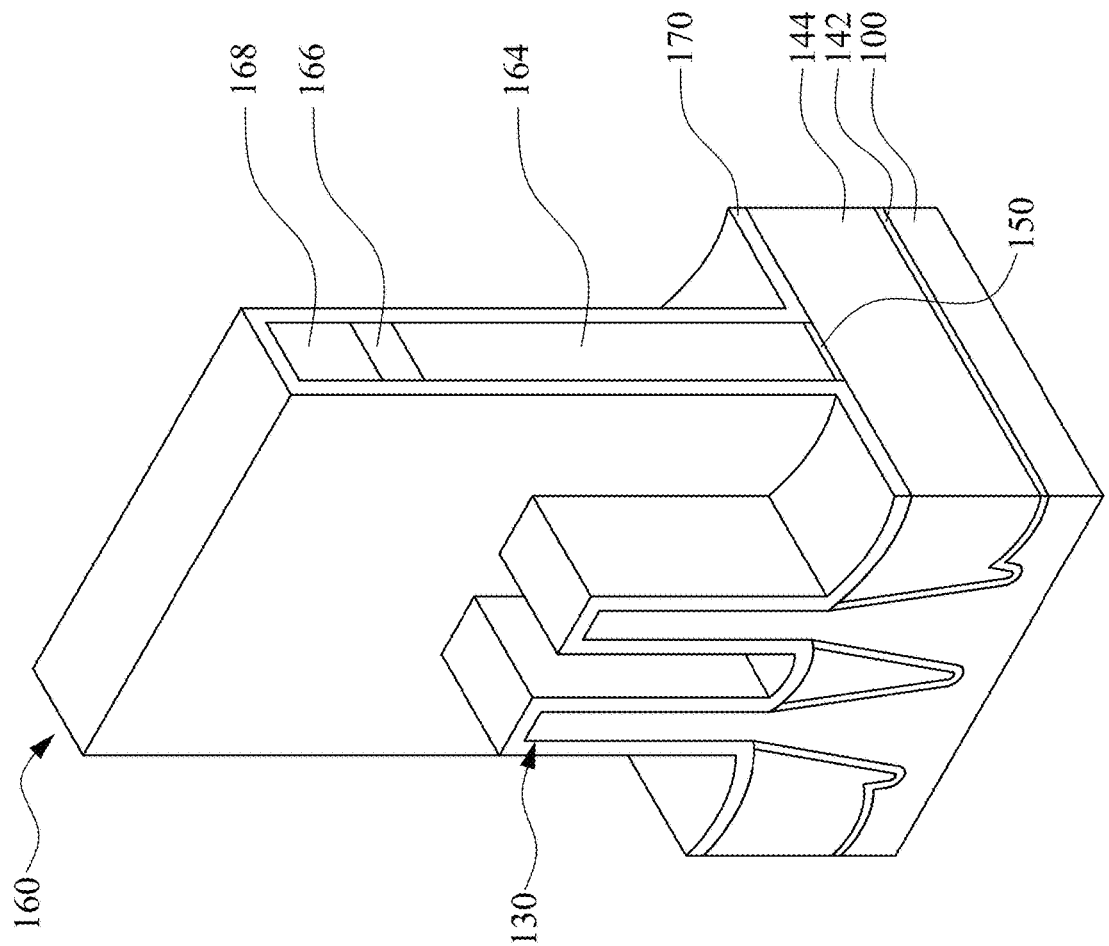

Referring to FIG. 8, after the sacrificial gate structure 160 is formed, a spacer layer 170 of an insulating material for sidewall spacers is conformally formed. The spacer layer 170 is deposited in a conformal manner so that it is formed to have substantially, equal thicknesses on vertical surfaces, such as the sidewalk, horizontal surfaces, and the top of the sacrificial gate structure. In one embodiment, the insulating material of the spacer layer 170 includes silicon, carbon, oxygen and nitrogen, such as SiOCN.

Figure 9:
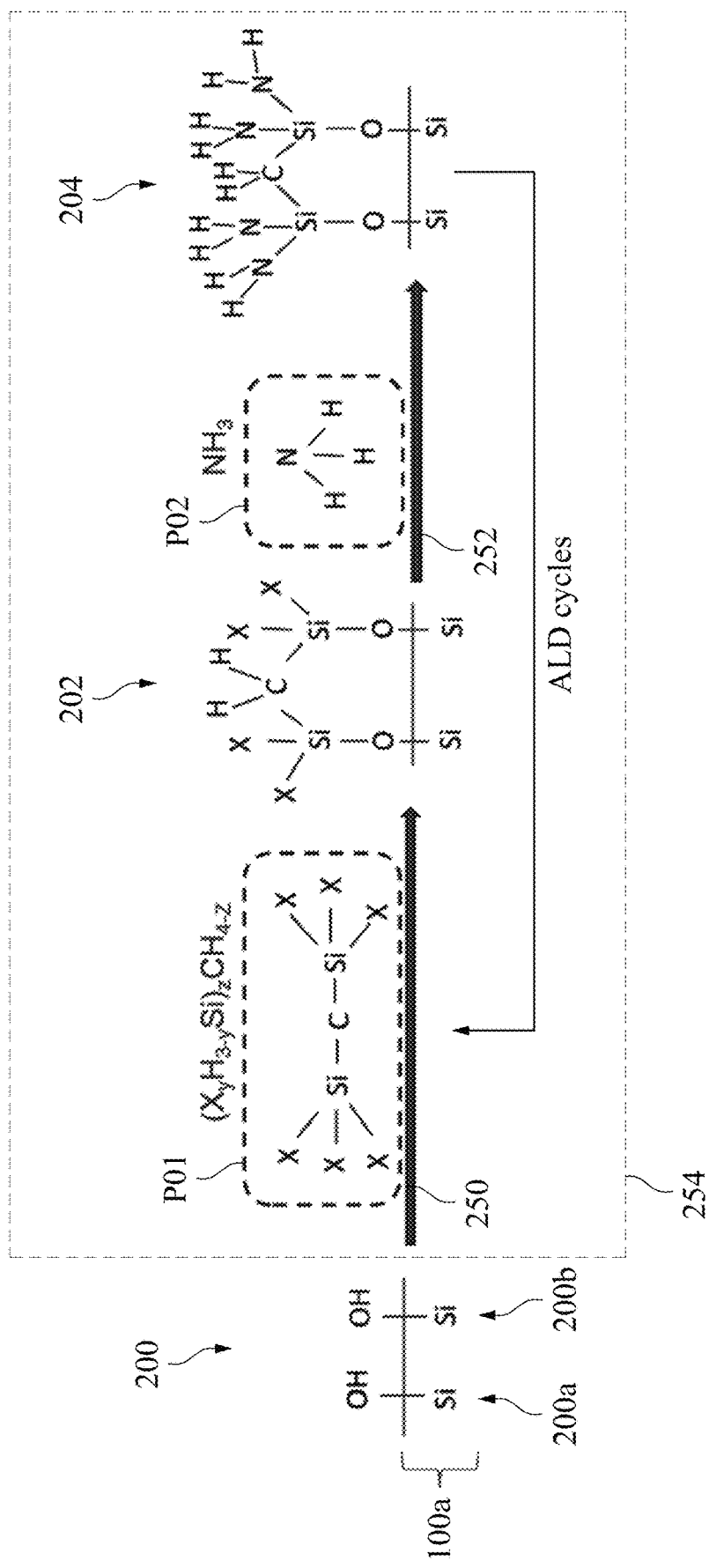
FIG. 9 illustrates Atomic Layer Deposition (ALD) cycles in the formation of a spacer layer in accordance with some embodiments.

FIG. 9 illustrates atomic layer deposition (ALD) cycles in the formation of the spacer layer 170 in accordance with some embodiments. In FIG. 9, some details for depositing the spacer layer 170 is illustrated, wherein some example intermediate chemical structures of the spacer layer 170 are illustrated. It is appreciated that the processes and structures as shown in (and discussed referring to) FIG. 9 are schematic, and other reaction mechanism and structures may also happen. The intermediate structures shown in FIG. 9 are identified using reference numerals 200, 202, 204 to distinguish the structures generated by different steps from each other. The substrate 100 includes a base layer 100a, which may represent the exposed features including the fin structure 130. The initial structure in FIG. 9 is referred to as the structure 200, in the illustrated example, the base layer 100a is shown as including silicon, which may be in the form of crystalline silicon, amorphous silicon, polysilicon, SiGe, or the like. In accordance with some embodiments of the present disclosure, due to the formation of native oxide and the exposure to moisture, Si—OH bonds are formed at the surface of the base layer 100a, Two neighboring structures 200a and 200b are illustrated in FIG. 9.

Figure 10:
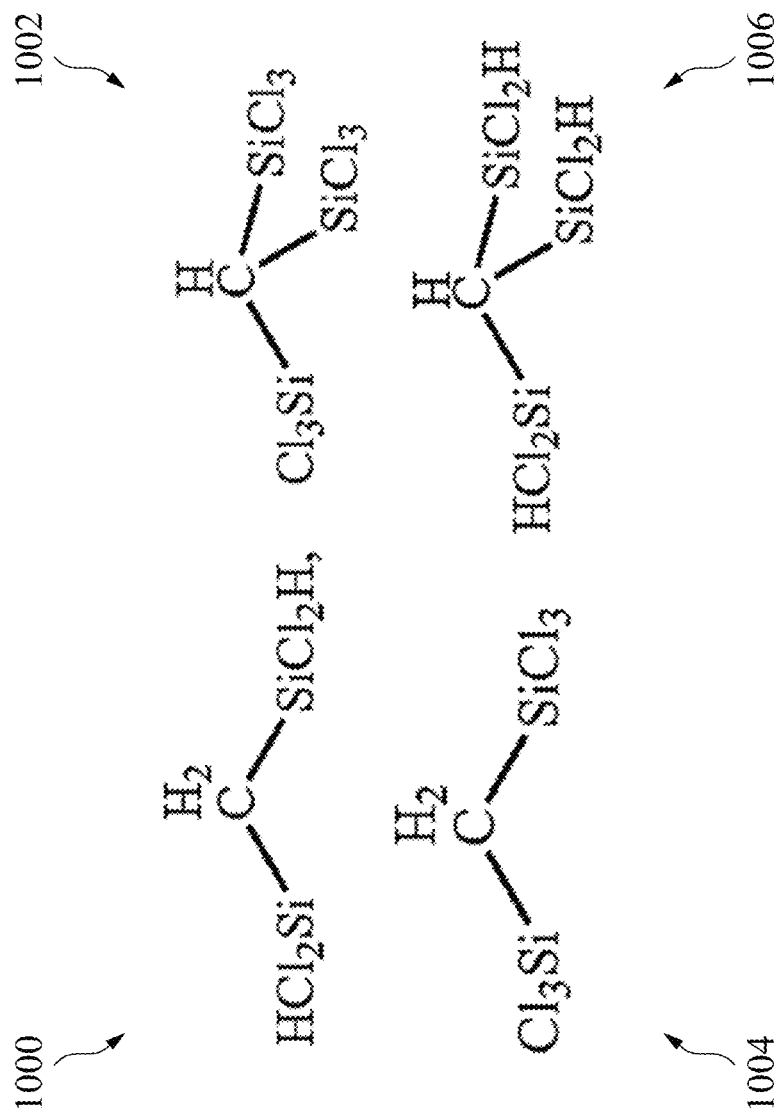
FIG. 10 illustrates four chemical structures of a molecule of a first precursor in some embodiments where X is chlorine atom in accordance with some embodiments.

Referring to FIG. 9 again, an ALD cycle 254 is performed to deposit the spacer layer 170 as in FIG. 8. Referring to a process 250, a first precursor P01 is introduced/pulsed into an ALD chamber, in which the substrate 100 (FIG. 8) is placed. The first precursor P01 can be an organo-silicate material having linked carbo-silane bonds, which includes Si—C—Si bonds. For example, the first precursor P01 is a carbosilane having a chemical formula $(X_yH_{3-y}Si)_zCH_{4-z}$, in which X may be a halogen atom (e.g., Cl, Br and/or I), y represents an integer of 1 to 4, and z represents an integer of 2 to 3. FIG. 10 illustrates four chemical structures 1000, 1002, 1004 and 1006 of a molecule of the first precursor 101 in some embodiments where X is chlorine atom. The chemical structures 1000 and 1004 show that the molecule includes chlorine atoms bonded to two silicon atoms, which are bonded to a carbon atom to form the Si—C—S bond (with the C being $CH_2$). The chemical structures 1002 and 1006 show that the molecule includes chlorine atoms bonded to three silicon atoms, which are bonded to a carbon atom to form the Si—C—S bond (with the C being CH). When the first precursor P01 is pulsed into the ALD chamber, the substrate 100 may be heated, for example, to a temperature in a range between about 250° C. and about 800° C. The OH bonds as, shown in the structure 200 (FIG. 9) are broken, and silicon atom along with the X atoms bonded to them are bonded to oxygen atoms to form O—S—X bonds. Si—C—S (with the C being in $CH_2$) are also formed to form a bridge structure connecting two Si—O bonds. The resulting structure is referred to as the structure 202. The first precursor P01 may be flowed into the ALD chamber at a flow rate of about 0.1 standard liter per minute (slm) to about 2 slm and may be kept in the ALD chamber for a period of time.

After the process 250 has finished, the first precursor P01 is purged from the ALD chamber by a purge gas such as argon, nitrogen, xenon, or other non-reactive gas to the ALD chamber. Next, further referring to FIG. 9, a process 252 is performed, and a cross-linking precursor (e.g., a second precursor P02 including a nitrogen atom(s) and/or hydrogen atom(s)) is pulsed into the ALD chamber. For example, ammonia ($NH_3$) may be pulsed. With the introduction/pulsing of ammonia, the temperature of the substrate 100 is also kept elevated, for example, in the range, between about 250° C. and about 800° C. The second precursor P02 may be flowed into the ALD chamber at a flow rate of about 1 slm to about 20 slm. In some embodiments, the flow rate ratio of the second precursor P02 to the first precursor P01 is from 1 to 30. In some alternative embodiments, the flow rate ratio of the second precursor P02 to the first precursor P01 is from 0.1 to 10.

The structure 202 reacts with ammonia. The resulting structure is referred to as the structure 204, as shown in FIG. 9. During the reaction, Si—X bonds in the structure 202 are broken and serve as sites for cross-linking during the process 252. Bonding at the reactive sites and cross-linking can form the structure 204 in which $NH_2$ molecules may be bonded to silicon atoms. The ammonia may be kept in the ALD chamber for a period of time, and is then purged from the ALD chamber. The total deposition time (e.g.; a sum of the process times of the processes 250 and 252) may be from 10 seconds to 200 seconds. The as-deposited spacer layer 170 may have a dielectric constant (or k-value) from 3.0 to 7.0 with an oxygen content between 0 atomic % and 50 atomic %, a carbon content between 1 atomic % and 25 atomic %, and a nitrogen content between 1 atomic % and 40 atomic %, and a density in a range from 2 $g/cm^3$ to 3 $g/cm^3$ depending on the composition thereof.

In above-discussed processes, the processes 250 and 252 in combination may be referred to as an ALD cycle 254, with the ALD cycle 254 resulting in the growth of an atomic layer, which includes silicon atoms and the corresponding bonded $NH_2$ and $CH_3$ groups. The ALD cycle 254 may be repeated to increase the thickness of spacer layer 170. The ALD cycle 254 are repeated until the spacer layer 170 reaches a desirable thickness. For example, the ALD cycle 254 may be 1 to 5. In some embodiments where the tin structures 130 have an aspect ratio of 10 to 50 (e.g., 30), the as-deposited spacer layer 170 may have a conformity from 50% to 99%.

Figure 11:
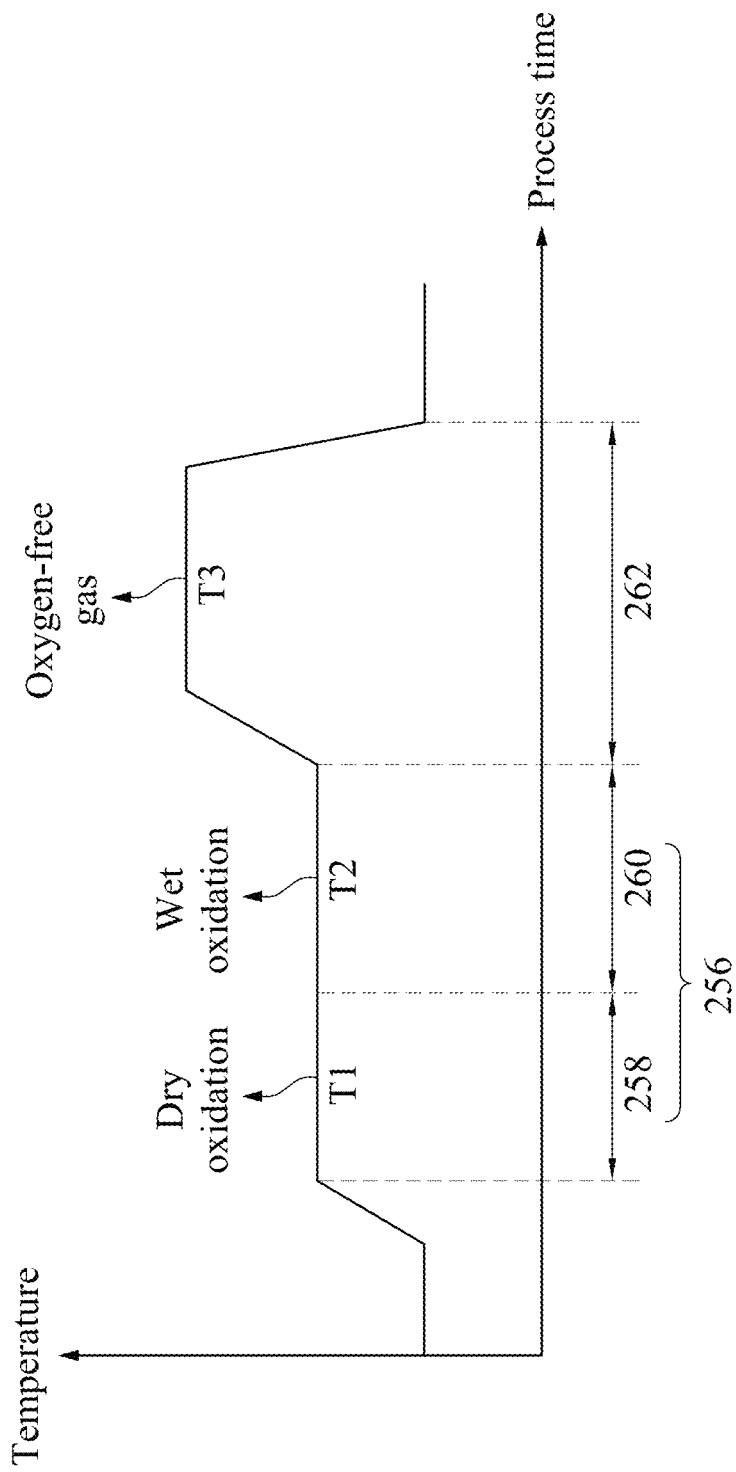
FIG. 11 shows an example graph of temperature versus process time illustrating aspects of the disclosure.
Figure 12:
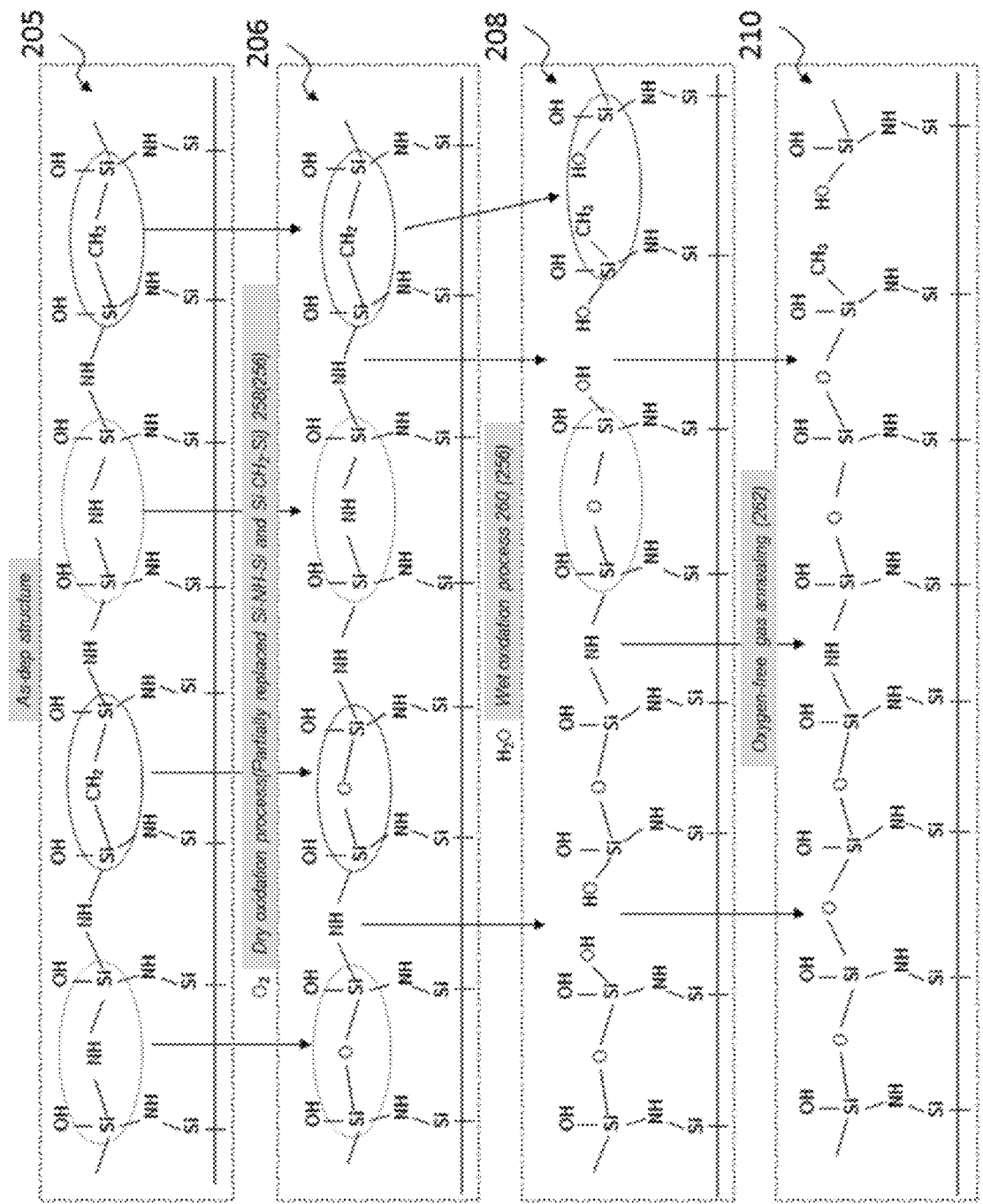
FIG. 12 illustrates a multi-step oxidation process performed to the spacer layer in accordance with some embodiments.

Next, the substrate 100 is transferred to an annealing system having a chamber surrounded by a housing in order to process a multi-step oxidation process (see FIG. 12). The annealing system may include a gas delivery system which introduces oxygen-containing gases into the chamber and a heating system which heats the substrate 100 to a desired temperature (see temperatures T1, T2 and T3 in FIG. 11). In some embodiments, the heating system includes a resistive heating element which may be formed of any suitable conductive material having bulk resistance and will generate heat when a voltage and current is applied across it. In some alternative embodiments, the heating system includes a radiant heat lamp. In some embodiments, the annealing system may be a rapid thermal processor (RTP).

FIG. 11 shows an example graph of temperature versus process time illustrating aspects of the disclosure. FIG. 12 illustrates a multi-step oxidation process 256 performed to the spacer layer 170 in accordance with some embodiments. An example structure 205 of a terminal portion of the as-deposited spacer layer 170 in which an additional layer of the spacer layer 170 is illustrated in FIG. 12, which more molecules of the first precursor P01 and the second precursor P02 (see FIG. 9) are attached to the underlying structure.

Referring to FIG. 11 and FIG. 12, a multi-step oxidation process 256 is performed. The multi-step oxidation process 256 includes a dry oxidation process 258 and a wet oxidation process 260. The dry oxidation process 258 and the wet oxidation process 260 are performed in the annealing system. For example, the wet oxidation process 260 is performed after the dry oxidation process 256 to prevent formation of strong Si—$CH_3$ bonds at an intermediate stage of the multi-step oxidation process 256, as compared to performing the wet oxidation process 260 prior to performing the dry oxidation process 258, which will be described in greater detail below in conjunction with FIG. 14. As a result, the carbon concentration and the nitrogen concentration in the spacer layer 170 can be tuned effectively.

In FIG. 12, the dry oxidation process 258 is performed using oxygen ($O_2$) as a process gas. The dry oxidation process 258 may also be performed in the annealing system being a furnace, with the pressure being one atmosphere, or in the annealing system being a process chamber (such as the ALD chamber), with the pressure being lower than one atmosphere. The dry oxidation process 258 may be performed at a temperature T1 (see FIG. 11) in the range between a temperature in a range from 200° C. to 750° C., for example, from 250° C. to about 800° C. In some alternative embodiments, the dry oxidation process 258 is performed at a temperature from 500° C. to 800° C. The duration of the dry oxidation process 258 may be in the range between about 0.1 hours and about 6 hours and under a pressure of about 0.01 atm to 2 atm. In some alternative embodiments, the total pressure of the gas in the annealing system is from 0.01 atm to 2 atm, a partial pressure ratio of the first precursor P01 (see FIG. 9) with respect to the total pressure of the gas in the annealing system is from 0.01 atm to 1 atm. In the dry oxidation process 258, oxygen partially replaces the NH part (which is bonded to Si atoms), also referred to as Si—NH, and the CH$_2$ part (which is bonded to Si atoms), also referred to as Si—CH$_2$—S to form Si—O—S bonds, and the resulting structure may also be represented by a structure 206. Because the dry oxidation process 258 has an oxidation rate much slower than an oxidation rate of the wet oxidation process 260, the structure 206 is partially oxidized by the dry oxidation process 258 while a part thereof remain un-oxidized. The dry oxidation process 258 cannot produce Si—CH$_3$ bond, even if the process temperature and the process time of the dry oxidation process 258 extend.

After the dry oxidation process 258 is performed, the wet oxidation process 260 is performed to the structure 206. The wet oxidation process 260 can produce Si—CH$_3$ bond. The resulting structure may be represented by a structure 208 as shown in FIG. 12. In some embodiments, in the wet oxidation process 260, the structure 208 is annealed in the annealing system being a furnace, with water steam (H$_2$O) as an oxidant introduced into the furnace. The wet oxidation process 260 may be performed at a pressure of one atmosphere, while it may also be performed in the annealing system being a process chamber (such as the ALD chamber for depositing the spacer layer 170) at a pressure lower than one atmosphere. The wet oxidation process 260 may be performed at a temperature T2 (see FIG. 11) in a range from 250° C. to 800° C. In an alternative embodiment, the temperature T2 is higher than the temperature T1 and is in a range from 800° C. to 1400° C. The duration of the wet oxidation process 260 may be in the range between about 0.1 hours and about 12 hours. In some embodiments, a total pressure of the gas in the ALD chamber is from 0.5 atm to 5 atm. In some alternative embodiments, the total pressure of the gas in the ALD chamber is from 0.01 atm to 2 atm, a partial pressure ratio of the second precursor P02 (see FIG. 9) with respect to the total pressure of the gas in the ALD chamber is from 0.01 atm to 1 atm.

The wet oxidation process 260 selectively reacts with nitrogen, for example, by a hydrogen bond between the H$_2$O and the nitrogen, in wet oxidation process 260, the Si—CH$_2$—S bond is replaced with Si—CH$_3$ bond and Si—OH bond, and the Si—NH—S bond is replaced with Si—NH$_2$ bond and Si—OH bond. That is, the oxygen partially replaces the NH part (which is bonded to Si atoms), also referred to as Si—NH, and the CH$_2$ part (which is bonded to Si atoms), also referred to as Si—CH—Si to form Si—O—Si bonds. By using the wet oxidation process 260 to create Si—CH$_3$ bond, the structure 208 can have increased porosity and increased hydrophobicity. Some oxygen atoms are replaced with F, C, CH$_3$ group, or a combination thereof. It is noted that H$_2$O has extremely polar O—H bonds and a k value close to 80. Even a small amount of absorbed water would significantly increase the total k-value. Because the Si—CH$_3$ bond is a hydrophobic group, the addition of CH$_3$ to the structure 208 not only creates additional free volume but introduces less polar bonds. Therefore, the structure 208 is unlikely to absorb water.

The wet oxidation process 260 results in breaking of more Si—N bonds (Si—NH$_2$ and Si—NH—Si), and the silicon atoms are bonded to OH groups. There may also be some NH$_2$ molecules left after the wet oxidation process 260. In the wet oxidation process 260, ammonia gas (NH$_3$) is generated. The sequence of the multi-step oxidation process 256 is beneficial for tuning the carbon concentration and the nitrogen concentration in the spacer layer 170. For example, in the multi-step oxidation process 256, the wet oxidation process 260 is performed after the dry oxidation process 258.

After the wet oxidation process 260, an anneal process 262 is performed using an oxygen-free gas such as nitrogen (N$_2$), argon, or the like may be used to carry away the water steam and the ammonia gas at a temperature 13 (see FIG. 11) in a range from about 400° C. to 1000° C. The anneal process 262 is thus also referred to as a de-moisture process. The resulting structure may be represented by a structure 212 as shown in FIG. 12.

In some embodiments, the duration of the wet oxidation process 260 can be used to control a depth of the oxidation of the spacer layer 170. For example, depending on the duration of the wet oxidation process 260, the depth of the oxidation of the spacer layer 170 can be in a range from 10 angstrom to 200 angstrom. After performing the anneal process the spacer layer 170 may have an oxygen content between 20 atomic % and 80 atomic %, a carbon content between 0 atomic % and 20 atomic %, nitrogen content between 0 atomic % and 30 atomic %, and a silicon content between 25% and 40%.

Figure 13:
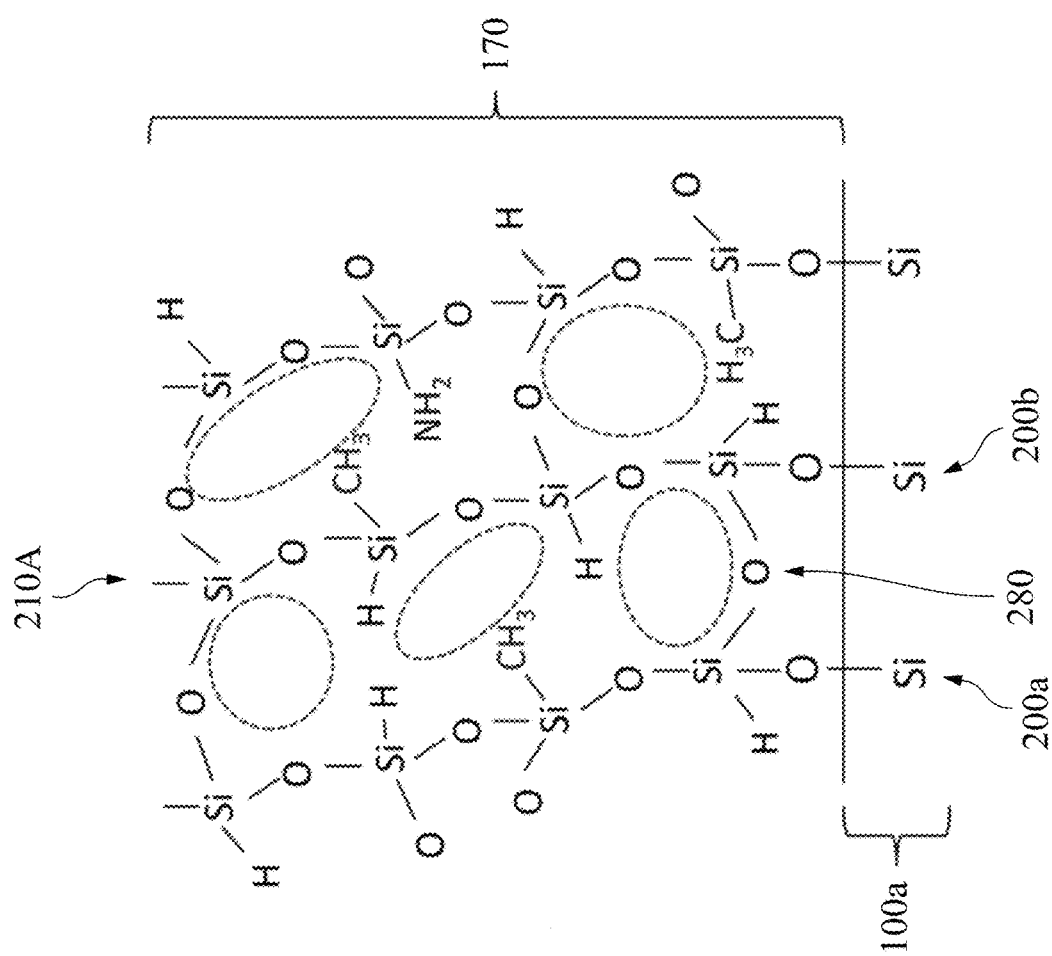
FIG. 13 represents an example structure formed after the multi-step oxidation process in accordance with some embodiments.

FIG. 13 represents an example structure 210A formed after the multi-step oxidation process 256 in accordance with some embodiments. The structure 210A includes two of the neighboring structures 200a, 200b (see FIG. 9) joined together. In accordance with some embodiments, a Si—OH bond in the structure 200a and a second Si—OH bond in the structure 200b are both broken, generating a Si—O—Si bond 280 and a 1120 molecule. The H$_2$O molecule is carried away. Also, some of the Si—CH$_2$—Si bonds (see structure 204 FIG. 9, which includes Si—C—Si bonds) react with 1420 molecules (either in air or generated by the de-moisture process) to form Si—OH bonds and Si—CH$_3$ bonds. The resulting film is the spacer layer 170, which is also shown in FIG. 8. The hydrophobic Si—CH$_3$ terminal group of the structure 210A increases a porosity of the spacer layer 170, resulting in the k value of the resulting spacer layer 170 to be reduced. As discussed above with regard to FIG. 12, some oxygen atoms in the spacer layer 170 are replaced with F, C, CH$_3$ group, or a combination thereof. It is noted that H$_2$O, has extremely polar O—H bonds and a k value close to 80. Even a small amount of absorbed water would significantly increase the total k-value. Because the Si—CH$_3$ bond is a hydrophobic group, the addition of CH$_3$ not only creates additional free volume but introduces less polar bonds. Therefore, the spacer layer 170 is unlikely to absorb water. The k value of the spacer layer 170 after the multi-step oxidation process 256 can be from 3.0 to 3.9. By controlling the multi-step oxidation process 256, the composition of the spacer layer 170 can be tuned. Based on the composition of the spacer layer 170, the density of the spacer layer 170 can be controlled to be reduced and the volume of the spacer layer 170 is increased accordingly. For example, the spacer layer 170 may have a volume expansion ratio of about 5% to about 30%.

Figure 14:
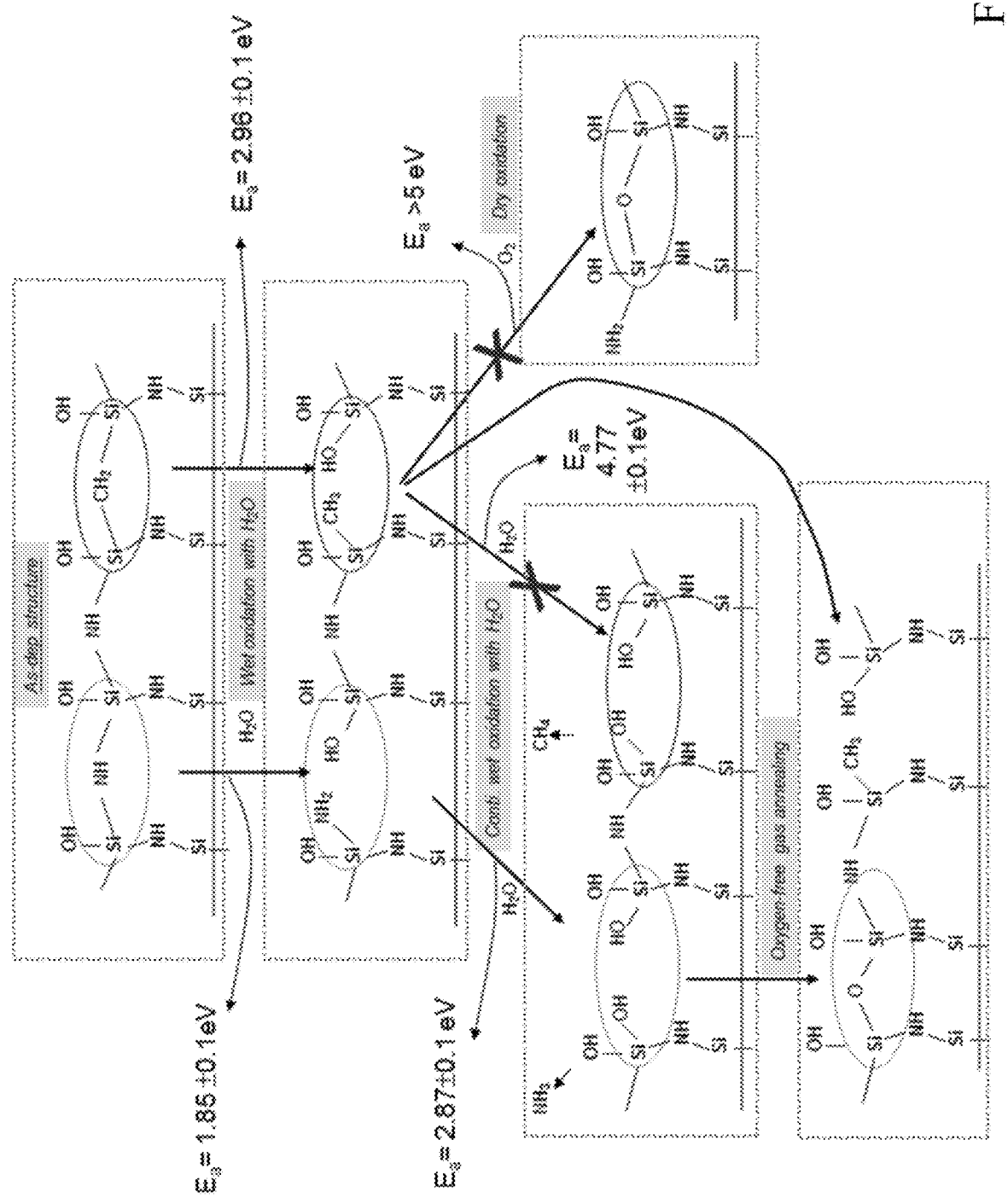
FIG. 14 illustrates a comparative example in which the wet oxidation process is performed before the dry oxidation process.

FIG. 14 illustrates a comparative example in which the wet oxidation process is performed before the dry oxidation process. In the wet oxidation using water as an oxidant, the Si—NH bond breaking into Si—NH$_2$ and Si—OH has a relatively low activation energy Ea (e.g., 1.85±0.1 eV) and the Si—CH$_2$—S bond breaking into Si—CH$_3$ and Si—OH bond has a relatively low activation energy Ea (e.g., 2.96±0.1 eV). If the wet oxidation process continues oxidizing the foregoing Si—NH$_2$ bond, the Si—NH$_2$ bond would break into Si—OH bond and an NH$_3$ molecule is generated, which has a relatively low activation energy of 2.87±0.1 eV, while, the Si—CH₃ bond breaking into Si—OH bond has a relatively high activation energy Ea (e.g., 4.77±0.1 eV), leading to controlling an oxygen concentration in the spacer layer 170 (see FIG. 1) more difficult. Also, in a followed dry oxidation using oxygen as an oxidant, the Si—CH₃ bond and Si—OH bond breaking into Si—O—S bond has a relatively high activation energy Ea (e.g., greater than 5 eV). In other words, the Si—CH₃ bond is strong and stable and thus is unlikely to undergo other chemical reactions. After the wet oxidation process, an anneal process is performed using an oxygen-free gas such that the two neighboring Si—OH bonds are both broken, generating a Si—O—S bond, while the Si—CH₃ with a neighboring Si—OH bond remain intact.

Referring to FIGS. 12 and 14, as compared to the comparative example in FIG. 14, the present disclosure provides a sequence of the multi-step oxidation process 256 (see FIG. 12) in which the dry oxidation process 258, which results in a partial oxidation of the spacer layer 170 (see FIG. 8), is performed before the wet oxidation process 260, which produces Si—CH₃ bonds in the spacer layer 170. As a result, a ratio of a carbon (C) concentration to a nitrogen (N) concentration in the spacer layer 170 can be controlled, improving the trade-off between the dielectric constant and the wet etch rate (WER) of the spacer layer 170.

Figure 15:
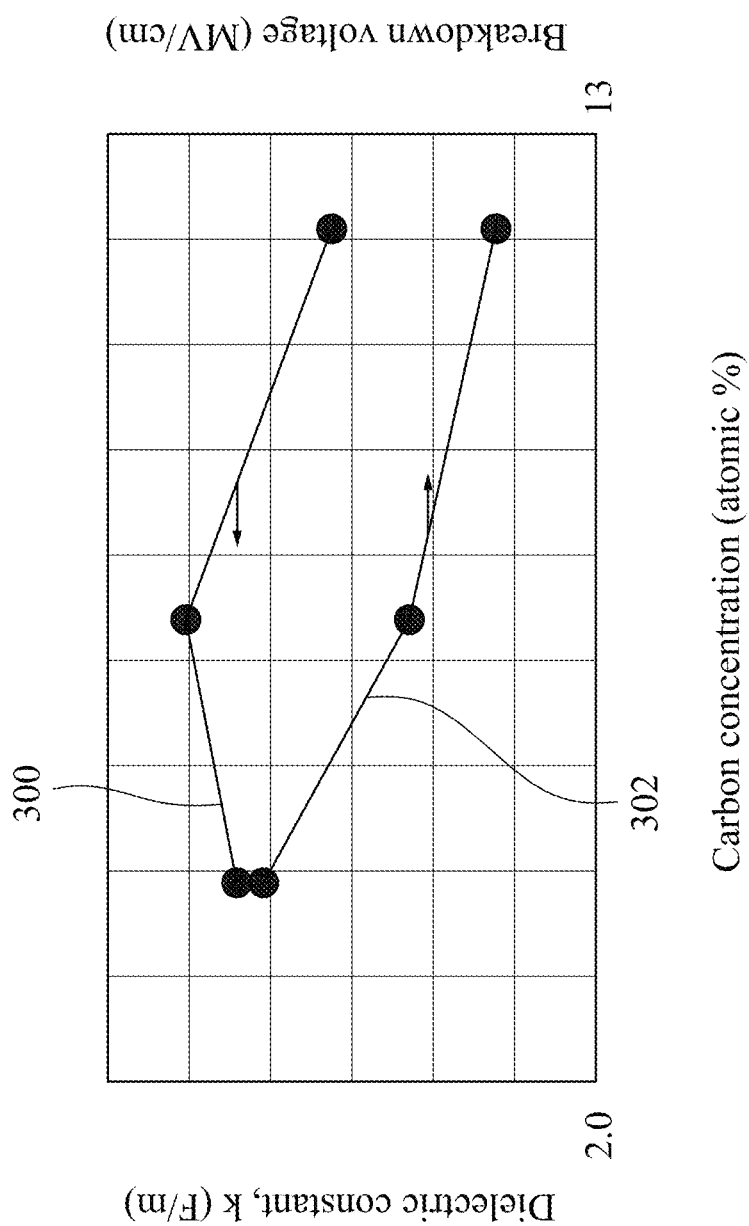
FIG. 15 shows an example graph of dielectric constant and breakdown voltage versus carbon concentration illustrating aspects of the disclosure.

FIG. 15 shows an example graph of dielectric constant (or k value) and breakdown voltage versus carbon concentration (atomic %) of the spacer layer 170, illustrating aspects of the disclosure. Line 300 stands for the k value. Line 302 stands for the breakdown voltage. Referring to FIG. 15, the k value is related to the carbon concentration of the spacer layer 170. For example, the k value decrease as the carbon concentration increases. The breakdown voltage of the device is related to the carbon concentration as well. By controlling the carbon concentration, the breakdown voltage capability of the device 10 can be enhanced. For example, the breakdown voltage is from 5 V to 25 V.

In accordance with some embodiments in which spacer layer 170 has a k value lower than about 3.8 (and may be in the range between about 3.5 and 3.8), the spacer layer 170 is a low-k dielectric layer including low-k material designed with a reduced dielectric constant, which can be accomplished by selecting chemical bonds with low polarizability and introducing porosity to decrease density. The spacer layer 170 is also referred to as a SiOCNH layer, or a SiOCN layer due to the relative small amount of hydrogen. The spacer layer 170 with low ii value can improve gate capacitance of the device.

Figure 16:
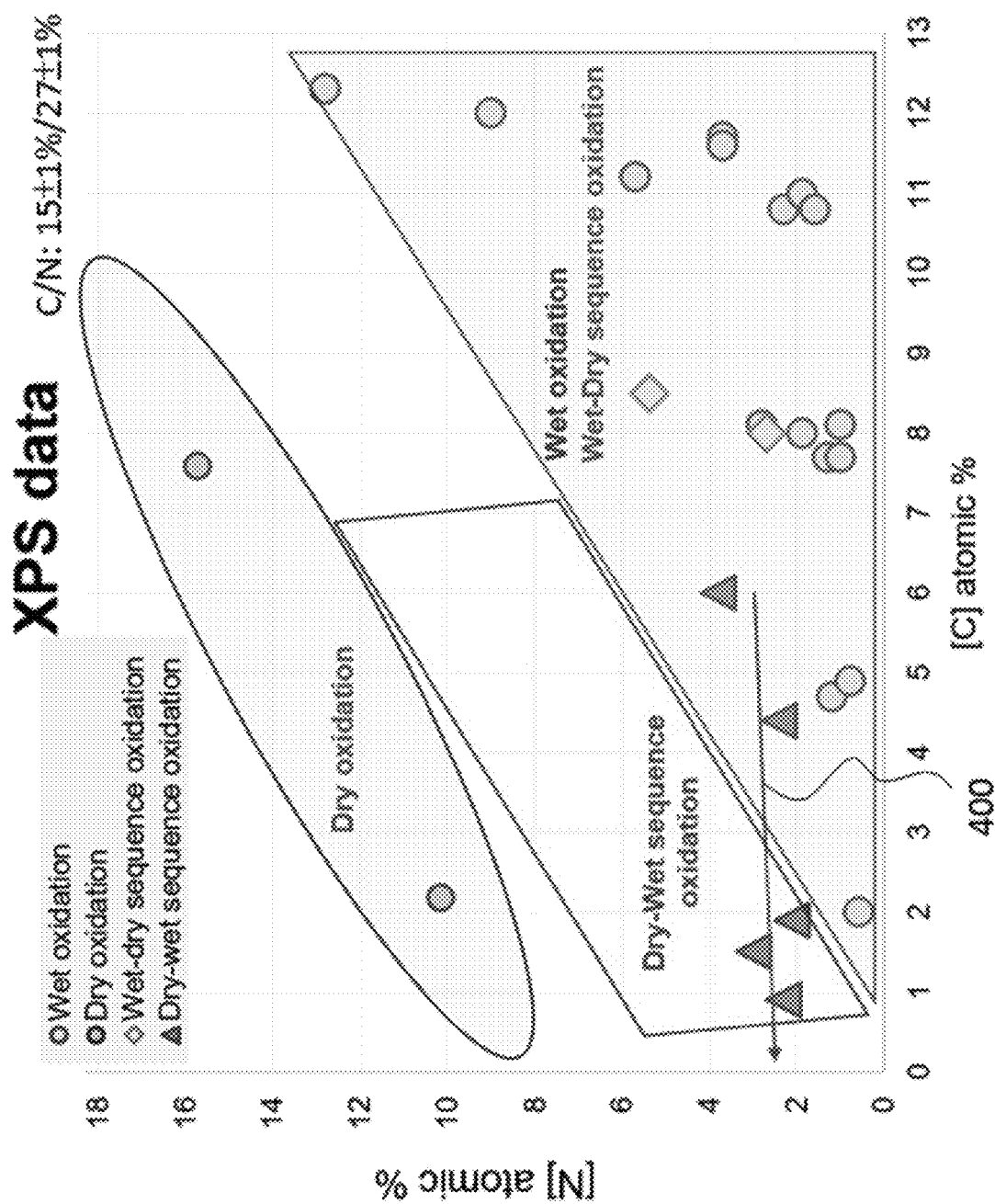
FIG. 16 shows an example graph of nitrogen atomic concentration versus carbon concentration illustrating aspects of the disclosure measured using X-ray photoelectron spectroscopy (XPS) of the spacer layer after the multi-step oxidation process.

FIG. 16 shows an example graph of nitrogen concentration versus carbon concentration of the spacer layer 170 after the multi-step oxidation process 256 (labeled as Dry-wet sequence oxidation) illustrating aspects of the disclosure measured using X-ray photoelectron spectroscopy (XPS). In condition where the as-deposited spacer layer has a carbon concentration of about 15±1 atomic % and a nitrogen, concentration of about 27±1 atomic %, in the Wet oxidation, the carbon concentration is stable and the nitrogen concentration can be modified. By contrast, in the dry oxidation, the carbon concentration can be modified while the nitrogen concentration tends to stay in a high concentration. In the Dry-wet sequence oxidation in accordance with some embodiments of the present disclosure, which includes the dry oxidation process followed by the wet oxidation process, carbon concentration and nitrogen concentration can be tuned along line 400, achieving a region beyond the regions of the carbon and nitrogen concentrations using a single dry oxidation, a single wet oxidation and a sequence of the wet oxidation followed by the dry oxidation (labeled as Wet-dry sequence oxidation).

Figure 17:
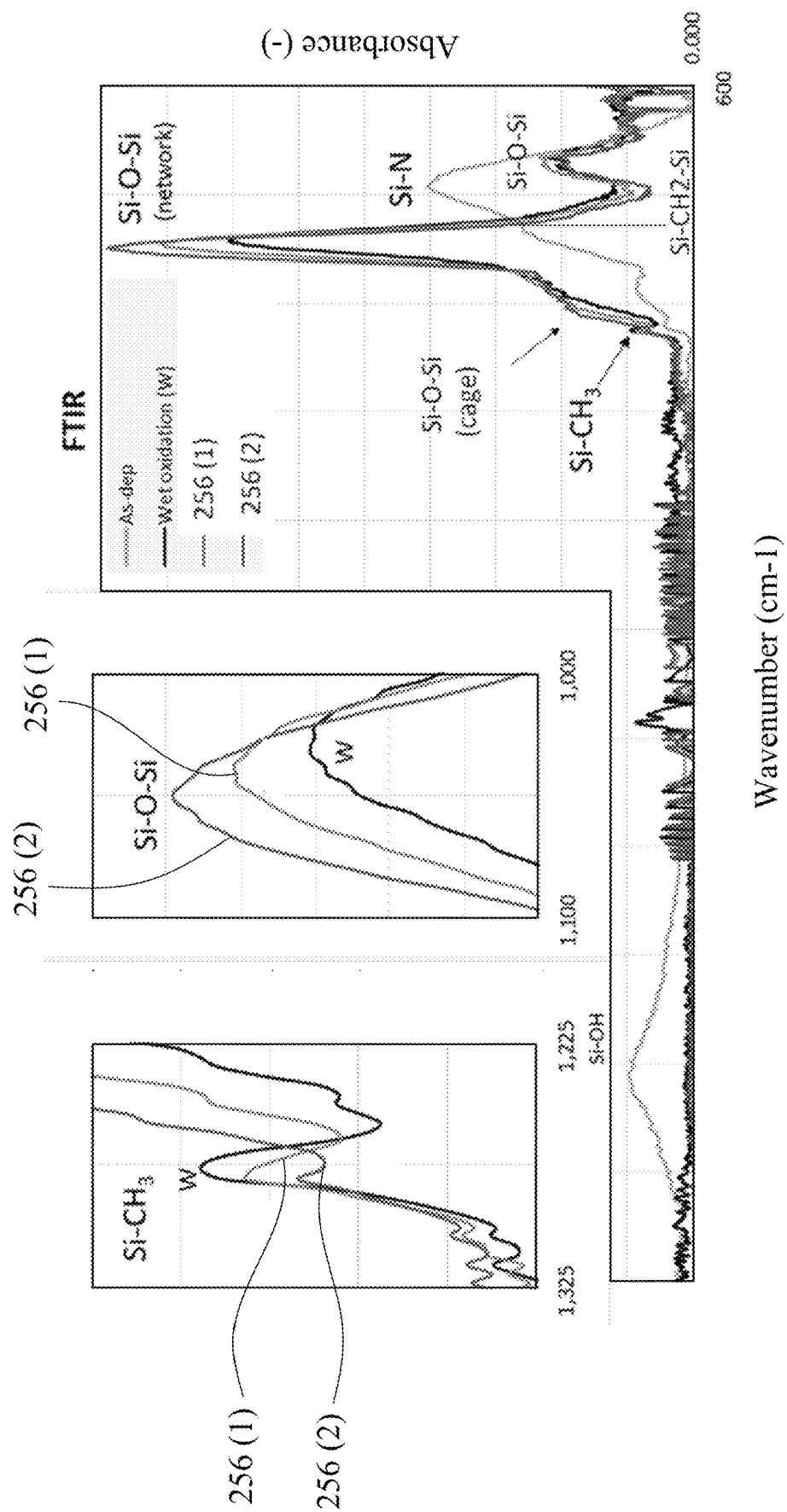
FIG. 17 illustrates Fourier transform infrared spectroscopy (FTIR) spectra illustrating aspects of the spacer layer after the multi-step oxidation process, according to some embodiments, compared to the as-deposited spacer layer and after a wet oxidation.

FIG. 17 illustrates Fourier transform infrared spectroscopy (FTIR) spectra illustrating aspects of the spacer layer 170 after the multi-step oxidation process 256 (labeled as 256(1) and 256(2)), according to some embodiments, compared to the as-deposited spacer layer 170 (labeled as As-dep) and the spacer layer 170 processed using a single wet oxidation (labeled as wet oxidation (W)). In the FUR spectra, the Si—O—S network structure show peaks in the 1200-1000 cm⁻¹ region, the Si—CH₃ structure show peaks in the 1275-1250 cm⁻¹. The FTIR spectra shows that the spacer layers 170 after the multi-step oxidation process 256 are most likely terminated with a combination of Si—CH bond hydrogen and hydrocarbon chains, bonded through an siloxane (Si—O—Si) linkage.

Figure 18:
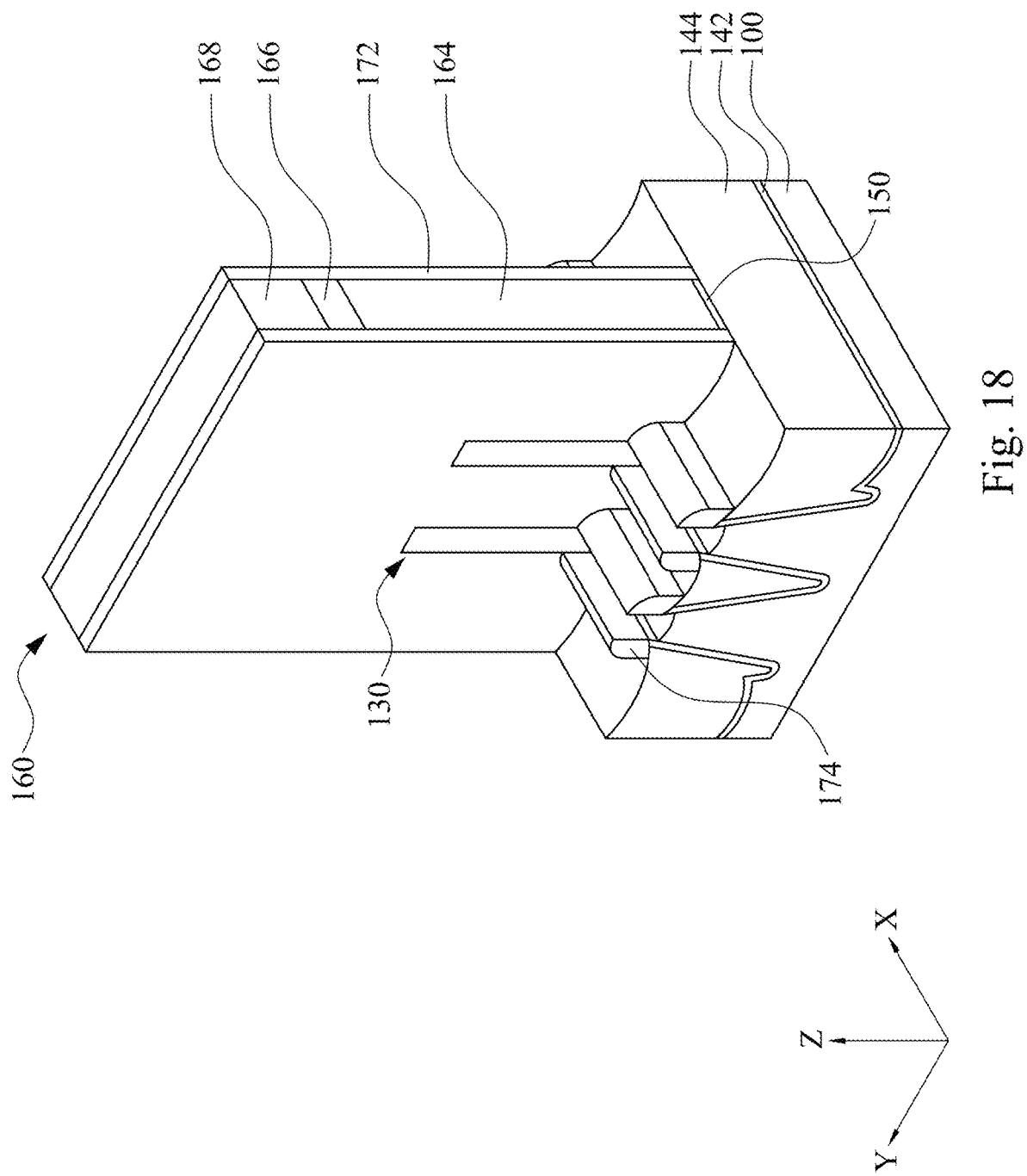
FIGS. 18-22 are perspective views of intermediate stages in the manufacturing of an example of a fin field-effect transistor (FinFET) in accordance with some embodiments.

The spacer layer 170 is then etched using an anisotropic process to form gate sidewall spacers 172 on opposite sidewalk of the sacrificial gate structure 160 and fin sidewall spacers 174 on opposite sidewalls of the fin structures 130, followed by etching exposed portions of the fin structures 130 that extend laterally beyond the gate sidewall spacers 172. The resulting structure is illustrated in FIG. 18. In some embodiments, the anisotropic process can be controlled such that no fin sidewall spacers 174 remain on the STI region 144.

The anisotropic etching performed on the spacer layer 170 can be, for example, reactive ion etching (RIE). During the anisotropic etching process, most of the insulating material is removed from horizontal surfaces, leaving the spacer layer 170 on the vertical surfaces such as the sidewalls of the sacrificial gate structures 160 and the sidewalls of the exposed fin structures 130. The mask layer 16 may be exposed from the gate sidewall spacers 172.

Figure 19:
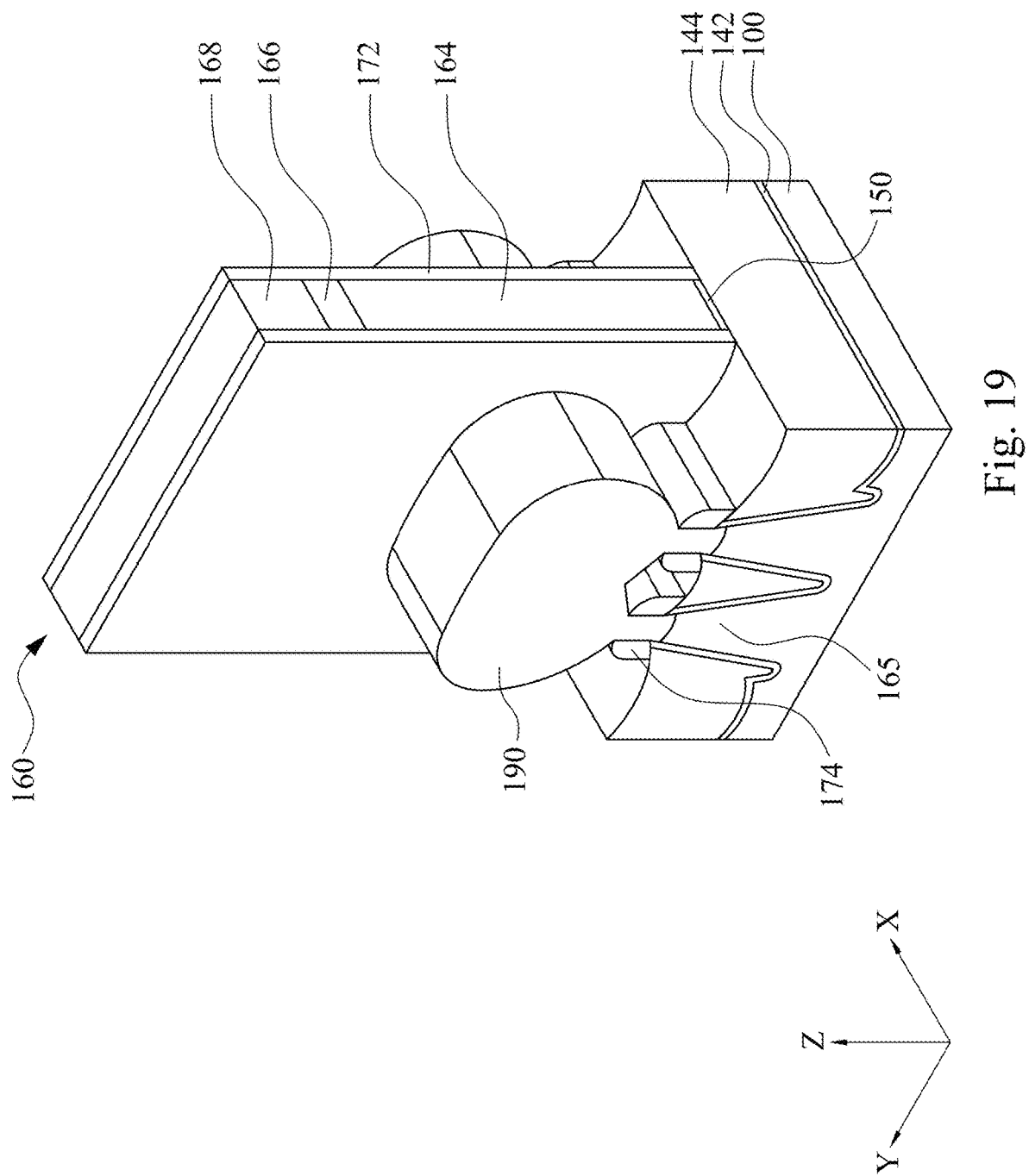

Subsequently, source/drain (SID) epitaxial layers 190 are epitaxially grown from the exposed recessed fins 165 between the fin sidewall spacers 174, as shown in FIG. 19. The S/D epitaxial layers 190 include one or more layers of SiGe doped with p-type dopants (e.g., boron, aluminum, or other suitable p-type dopants) for a p-channel FET. The S/D epitaxial layers 190 include one or more layers of SiC or SiP doped with n-type dopants (e.g., phosphorous, arsenic, or other suitable n-type dopants) for an n-channel FET. The S/D epitaxial layers 190 are formed by an epitaxial growth method using CVD, ALD or molecular beam epitaxy (MBE). In some embodiments, the epitaxial layers 190 grown from neighboring recessed fins 165 of the substrate 100 merge above the STI 144 and form a void in some embodiments. In some other embodiments, the epitaxial layers 190 grown from neighboring recessed fins 165 are not merged and thus separated from each other.

Figure 20:
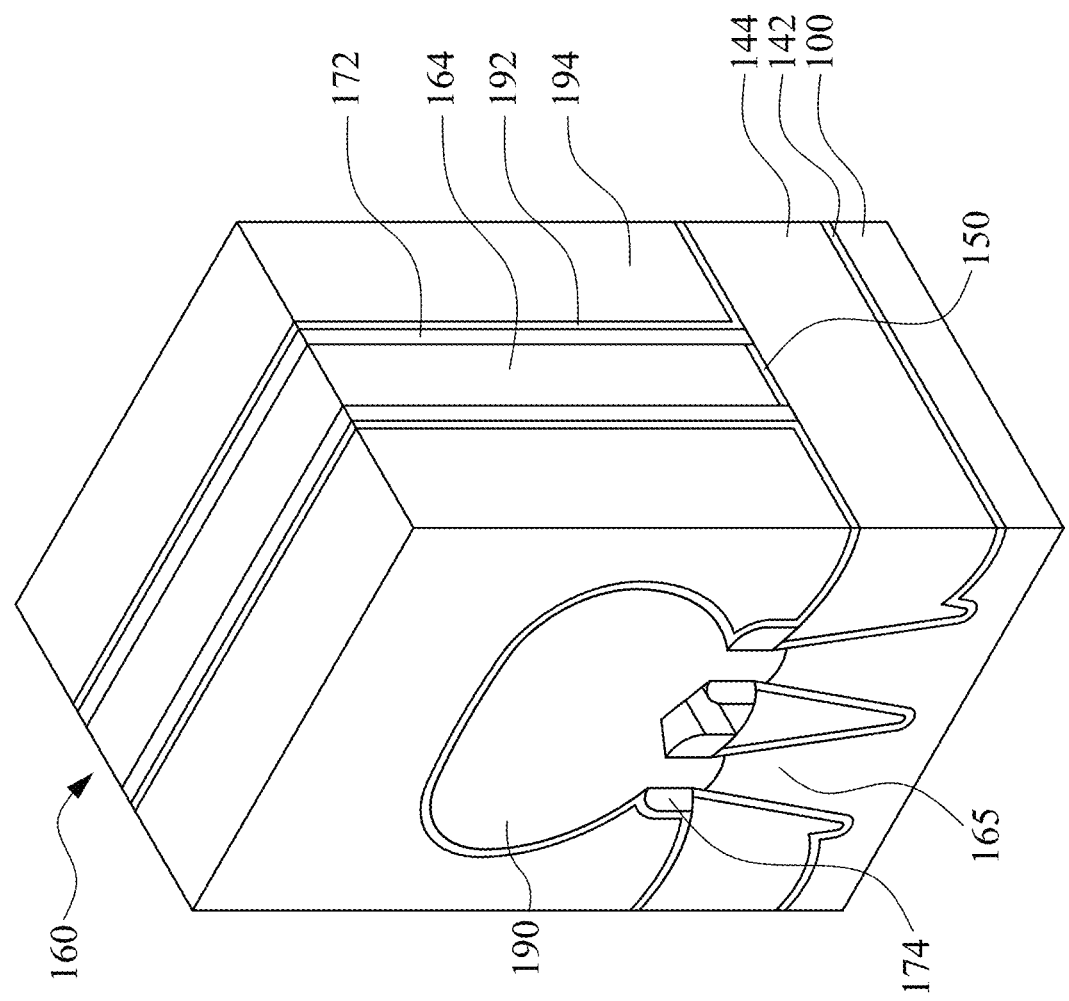

Subsequently, a second liner layer 192 is formed and then an interlayer dielectric (ILD) layer 194 is formed, as shown in FIG. 20. The second liner layer 192 is made of a silicon nitride-based material, such as SiN, and functions as a contact etch stop layer in the subsequent etching operations. The materials for the ILD layer 194 include compounds comprising Si, O, C and/or H, such as silicon oxide, SiCOH and SiOC. Organic materials, such as polymers, may be used for the ILD layer 194.

As shown in FIG. 20, after the ILD layer 194 is formed, a planarization operation, such as CMP, is performed, so that the top portion of the sacrificial gate structure 160 is exposed.

Figure 21:
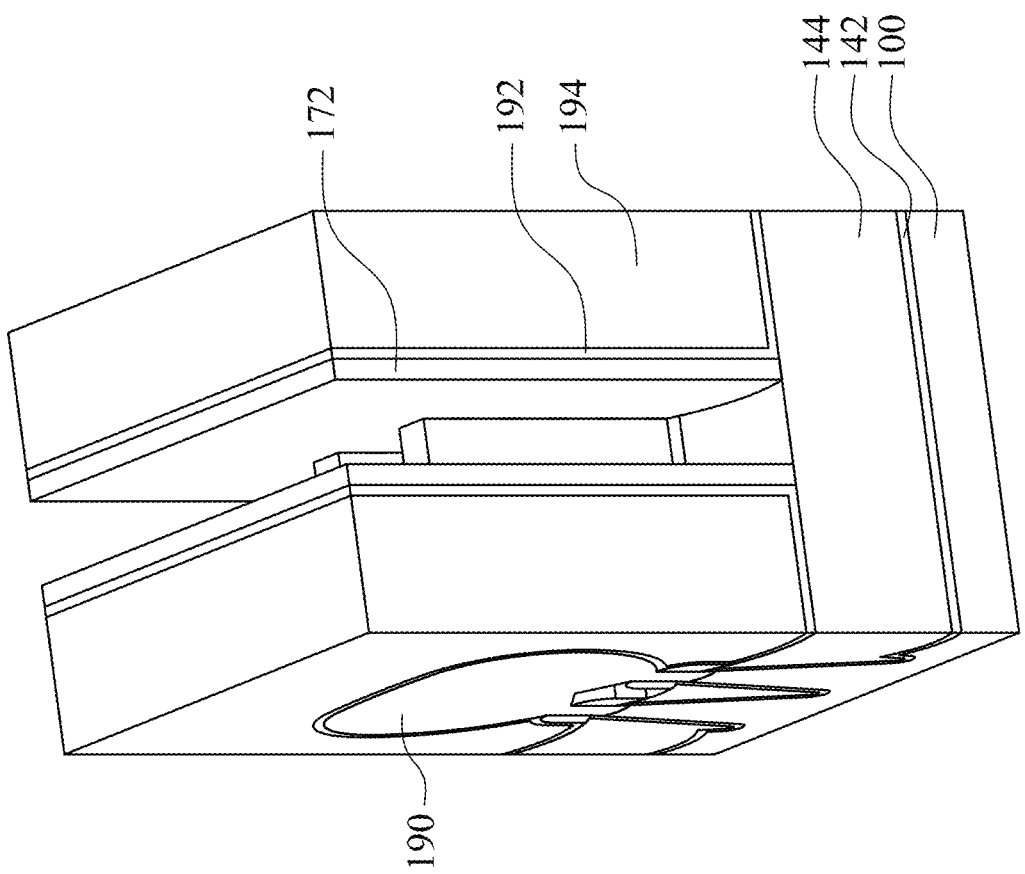

Next, as shown in FIG. 21, the sacrificial gate electrode layer 164 (see FIG. 20) and the sacrificial gate dielectric layer 150 (see FIG. 20) are removed, thereby exposing the fin structure 130 between the gate sidewall spacers 172.

The ILD layer 194, the contact etch stop layer 192 and the gate sidewall spacers 172 protect the SID epitaxial layers 190 during the removal of the sacrificial gate structures. The sacrificial gate structure 160 can be removed using plasma dry etching and/or wet etching. When the sacrificial gate electrode layer 164 is polysilicon and the ILD layer 194 is silicon oxide, a wet etchant such as a TMAH solution can be used to selectively remove the sacrificial gate electrode layer 164. The sacrificial gate dielectric layer 150 is thereafter removed using plasma dry etching and/or wet etching. As discussed previously, by tuning the composition of the spacer layer 170 using the multi-step oxidation process, the resulting gate sidewall spacers 172 may have improved etch resistance, which helps in device reliability. For example, in the wet etching process to remove the sacrificial gate electrode layer 164, the gate sidewall spacers 172 are exposed to the etching chemicals and the cleaning chemicals, and the improved etch resistance of the gate sidewall spacers 172 advantageously results in reduced damage to the gate sidewall spacers 172.

Figure 22:
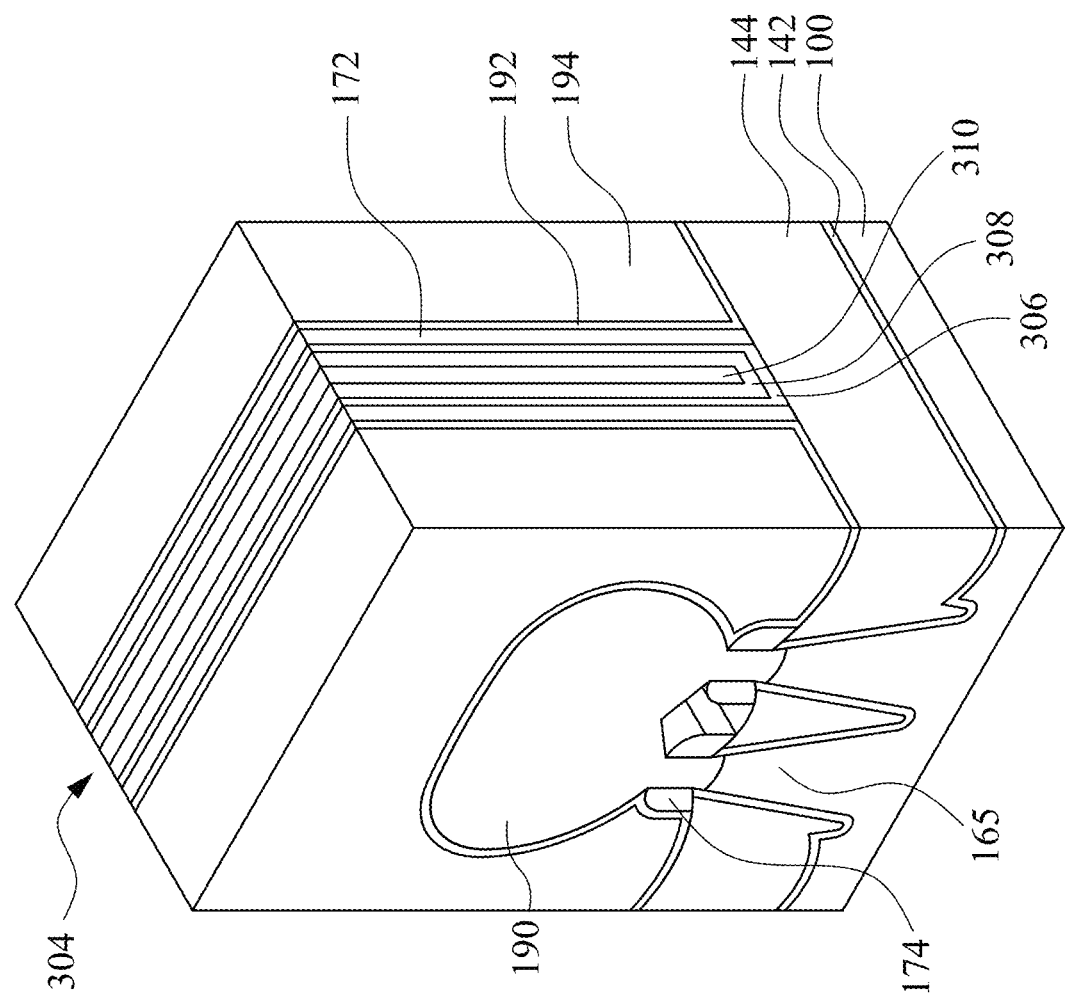

The removal of the sacrificial gate electrode layer 164 results in an opening or a trench. A metal gate structure 304 may be subsequently formed in the trench or opening over the tin structures 130 in the channel region, as shown in FIG. 22. In some embodiments, source/drain contacts (not shown) are formed over the SID epitaxial layers 190. The metal gate structure 304 extends in a Y-direction. The metal gate structure 304 may be the final gate of FinFETs. The final gate structure may be a high-k/metal gate (HKMG) stack, however other compositions are possible.

In some embodiments, the metal gate structure 304 forms the <gate associated with the three-sides of the channel region provided by the fin structure 130. Stated another way, the metal gate structure 304 wraps around the fin structure 130 on three sides. In various embodiments, the metal gate structure 304 includes a gate dielectric layer 306 lining the gate trench, a work function metal layer 308 formed over the gate dielectric layer 306, and a fill metal 310 formed over the work function metal layer 308 and filling a remainder of gate trench. The gate dielectric layer 306 includes an interfacial layer (e.g., silicon oxide layer) and a high-k gate dielectric layer over the interfacial layer. The interfacial layer is formed of silicon oxide or silicon oxynitride grown by a thermal oxidation process. For example, the interfacial layer can be grown by wet oxidation, a rapid thermal oxidation (RTO) process or by an annealing process using oxygen. In some embodiments where the interfacial layer is formed by oxidation, all exposed semiconductor surfaces may be oxidized, and thus exposed surfaces of the fin structures 130 are all coated with the interfacial layer.

High-k gate dielectrics, as used and described herein, include dielectric materials having a high dielectric constant, for example, greater than that of thermal silicon oxide (~3.9). The work function metal layer 308 and/or the fill metal 310 used within metal gate structure 304 may include a metal, metal alloy, or metal silicide. Formation of the metal gate structure 304 may include multiple deposition processes to form various gate materials, one or more liner layers, and one or more CMP processes to remove excessive gate materials.

In some embodiments, the high-k dielectric layer of the gate dielectric layer 306 may include metal oxides. Examples of metal oxides include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The high-k dielectric layer of the gate dielectric layer 306 may be formed using, a suitable process such as ALD, chemical vapor deposition (CVD) physical vapor deposition (PVD) or other suitable method.

The work function metal layer 308 may include work function metals to provide a suitable, work function for the high-k/metal gate structures 304. For an n-type FinFET, the work function metal layer 308 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 308 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 310 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Based on the above discussion, it can be seen that the present disclosure offers advantages. It is understood, however, that other embodiments may offer additional advantages, and not all advantages are necessarily disclosed herein, and that no particular advantages are required for all embodiments. One advantage is that the carbon concentration and the nitrogen concentration can be tuned effectively by a multi-step oxidation process. Another advantage is that the trade-off between the dielectric constant and the etch resistance of the gate sidewall spacer can be improved by the suitable carbon concentration and the nitrogen concentration. It s understood that the FinFET fabrication process as discussed above is merely one illustrative process for describing the spacers formed using multi-step oxidation process. The multistep oxidation process can also be integrated into fabrication processes of other spacers, such as planar transistor gate spacers, gate-all-around (GAA) FET gate spacers.

In some embodiments, a method of forming a semiconductor device includes forming a sacrificial gate structure over a substrate, depositing a spacer layer on the sacrificial gate structure in a conformal manner, performing a multi-step oxidation process to the spacer layer, etching the spacer layer to form gate sidewall spacers on opposite sidewalls of the sacrificial gate structure, removing the sacrificial gate structure to form a trench between the gate sidewalls spacers, and forming a metal gate structure in the trench. In some embodiments, depositing the spacer layer includes introducing a first precursor having a chemical formula $(X_y H_{3-y} Si)_z CH_{4-z}$, wherein X is a halogen atom, y is 1, 2, 3 or 4, and z is 2 or 3. In some embodiments, depositing the spacer layer further includes introducing an ammonia gas after introducing the first precursor. In, some embodiments, performing the multi-step oxidation process includes performing a dry oxidation process and performing a wet oxidation process using water steam. In some embodiments, the wet oxidation process is performed after the dry oxidation process. In some embodiments, the method further includes after the wet oxidation process, annealing the spacer layer. In some embodiments, annealing the spacer layer includes using an oxygen-free gas to carry away the water steam. In some embodiments, the oxygen-free gas includes nitrogen.

In some embodiments, a method of forming a semiconductor device includes forming a sacrificial gate structure over a substrate, depositing a spacer layer on the sacrificial gate structure in a conformal manner, wherein the spacer layer includes Si—C—S bond and silicon atoms bonded to $NH_2$ group, dry oxidizing the spacer layer with oxygen to turn the Si—C—S bond of the spacer layer into Si—O—S bond, after dry oxidizing the spacer layer selectively reacting with nitrogen, performing a wet anneal process, etching the spacer layer to form gate sidewall spacers on opposite sidewalls of the sacrificial gate structure, removing the sacrificial gate structure to form a trench between the gate sidewalls spacers, and forming a metal gate structure in the trench. In some embodiments, the wet anneal process is performed to replace the $NH_2$ group of the spacer layer with OH group. In some embodiments, during the wet anneal process, the Si—O—S bond of the spacer layer is not broken. In some embodiments, during dry oxidizing the spacer layer, the Si—C—S bond of the spacer layer does not become Si—$CH_3$. In some embodiments, the wet anneal process increases a volume of the spacer layer. In some embodiments, a ratio of the spacer layer after the wet anneal process to the spacer layer before the wet anneal process is in a range of about 105% to about 130%. In some embodiments, the method further includes performing a de-moisture process after the wet anneal process. In some embodiments, after the wet anneal process, the spacer layer has an oxygen content between 20 atomic % and 80 atomic %, a carbon content between 0 atomic % and 20 atomic % and a nitrogen content between 0 atomic % and 30 atomic %. In some embodiments, the wet anneal process is performed in a furnace under one atmosphere. In some embodiments, the wet anneal process is performed at a process temperature higher than a process temperature of oxidizing the spacer layer.

In some embodiments, a semiconductor device includes a substrate, a gate structure over the substrate and gate sidewall spacers on opposite sides of the gate structure. The gate sidewall spacers have an oxygen content between 20 atomic % and 80 atomic %, a carbon content between 0 atomic % and 20 atomic %, a nitrogen content between 0 atomic % and 30 atomic %, and a silicon content between 25% and 40%. In some embodiments, the gate sidewall spacers have a k value in a range from 3.0 to 3.9.

The foregoing outlines features of several embodiments so, that those skilled in the art may better understand the aspects of the present disclosure. Those skilled in the art should appreciate that they may readily use the present disclosure as a basis for designing or modifying other processes and structures for carrying our the same purposes and/or achieving the same advantages of the embodiments introduced, herein. Those skilled in the art should also realize that such equivalent constructions do not depart from the spirit and scope of the present disclosure, and that they may make various changes, substitutions, and alterations herein without departing from, the spirit and scope of the present disclosure.

What is claimed is:

1. A method of forming a semiconductor device, comprising:
   forming a sacrificial gate structure over a substrate;
   depositing a spacer layer on the sacrificial gate structure in a conformal manner;
   performing a multi-step oxidation process to the spacer layer;
   etching the spacer layer to form gate sidewall spacers on opposite sidewalls of the sacrificial gate structure;
   removing the sacrificial gate structure to form a trench between the gate sidewalls spacers; and
   forming a metal gate structure in the trench.

2. The method of claim 1, wherein depositing the spacer layer comprises:
   introducing a first precursor having a chemical formula $(X_yH_{3-y}Si)_zCH_{4-z}$, wherein X is a halogen atom, y is 1, 2, 3 or 4, and z is 2 or 3.

3. The method of claim 2, wherein depositing the spacer layer further comprises:
   introducing an ammonia gas after introducing the first precursor.

4. The method of claim 1, wherein performing the multi-step oxidation process comprises:
   performing a dry oxidation process; and
   performing a wet oxidation process using water steam.

5. The method of claim 4, wherein the wet oxidation process is performed after the dry oxidation process.

6. The method of claim 4, further comprising:
   after the wet oxidation process, annealing the spacer layer.

7. The method of claim 6, wherein annealing the spacer layer comprises using an oxygen-free gas to carry away the water steam.

8. The method of claim 7, wherein the oxygen-free gas includes nitrogen.

9. A method of forming a semiconductor device, comprising:
   forming a sacrificial gate structure over a substrate;
   depositing a spacer layer on the sacrificial gate structure in a conformal manner, wherein the spacer layer includes Si—C—Si bond and silicon atoms bonded to $NH_2$ group;
   dry oxidizing the spacer layer with oxygen to turn the Si—C—Si bond of the spacer layer into Si—O—Si bond;
   after dry oxidizing the spacer layer, performing a wet anneal process selectively reacting with nitrogen;
   etching the spacer layer to form gate sidewall spacers on opposite sidewalls of the sacrificial gate structure;
   removing the sacrificial gate structure to form a trench between the gate sidewalls spacers; and
   forming a metal gate structure in the trench.

10. The method of claim 9, wherein the wet anneal process is performed to replace the $NH_2$ group of the spacer layer with OH group.

11. The method of claim 9, wherein during the wet anneal process, the Si—O—Si bond of the spacer layer is not broken.

12. The method of claim 9, wherein during dry oxidizing the spacer layer, the Si—C—Si bond of the spacer layer does not become Si—$CH_3$.

13. The method of claim 9, wherein the wet anneal process increases a volume of the spacer layer.

14. The method of claim 9, wherein a ratio of the spacer layer after the wet anneal process to the spacer layer before the wet anneal process is in a range of about 105% to about 130%.

15. The method of claim 9, further comprising:
    performing a de-moisture process after the wet anneal process.

16. The method of claim 9, wherein after the wet anneal process, the spacer layer has an oxygen content between 20 atomic % and 80 atomic %, a carbon content between 0 atomic % and 20 atomic % and a nitrogen content between 0 atomic % and 30 atomic %.

17. The method of claim 9, wherein the wet anneal process is performed in a furnace under one atmosphere.

18. The method of claim 9, wherein the wet anneal process is performed at a process temperature higher than a process temperature of oxidizing the spacer layer.

19. A method of forming a semiconductor device, comprising:
- forming a sacrificial gate structure over a substrate;
- depositing a spacer layer on the sacrificial gate structure in a conformal manner;
- performing a multi-step oxidation process to the spacer layer, the multi-step oxidation process comprises a dry oxidation process and a wet oxidation process;
- etching the spacer layer to form gate sidewall spacers on opposite sidewalls of the sacrificial gate structure;
- removing the sacrificial gate structure to form a trench between the gate sidewalls spacers; and
- forming a metal gate structure in the trench.

20. The method of claim 19, wherein depositing the spacer layer comprises:
- introducing a first precursor having a chemical formula $(X_yH_{3-y}Si)_2CH_{4-z}$, wherein X is a halogen atom, y is 1, 2, 3 or 4, and z is 2 or 3.

* * * * *